United States Patent
Yasuda et al.

(10) Patent No.: US 8,330,344 B2
(45) Date of Patent: Dec. 11, 2012

(54) ELECTRON GUN MINIMIZING SUBLIMATION OF ELECTRON SOURCE AND ELECTRON BEAM EXPOSURE APPARATUS USING THE SAME

(75) Inventors: Hiroshi Yasuda, Tokyo (JP); Takeshi Haraguchi, Tokyo (JP); Hiroshi Shimoyama, Nagoya (JP); Hidekazu Murata, Nagoya (JP)

(73) Assignee: Advantest Corp., Tokyo (JP)

( * ) Notice: Subject to any disclaimer, the term of this patent is extended or adjusted under 35 U.S.C. 154(b) by 49 days.

(21) Appl. No.: 12/586,792

(22) Filed: Sep. 28, 2009

(65) Prior Publication Data

US 2010/0019648 A1   Jan. 28, 2010

Related U.S. Application Data

(63) Continuation of application No. PCT/JP2007/069855, filed on Oct. 11, 2007.

(30) Foreign Application Priority Data

Mar. 29, 2007   (JP) ................................. 2007-056800

(51) Int. Cl.
*H01J 29/50*   (2006.01)
*H01J 29/00*   (2006.01)
(52) U.S. Cl. .......................... 313/412; 313/409; 313/364
(58) Field of Classification Search ........................ None
See application file for complete search history.

(56) References Cited

U.S. PATENT DOCUMENTS
2005/0174030 A1   8/2005   Katsap

FOREIGN PATENT DOCUMENTS

| | | |
|---|---|---|
| EP | 0384684 | 8/1990 |
| JP | 59-012534 | 1/1984 |
| JP | 64-076654 | 3/1989 |
| JP | 08-184699 | 7/1996 |
| JP | 2000-285839 | 10/2000 |
| JP | 2001-325910 | 11/2001 |
| JP | 2003-016987 | 1/2003 |
| JP | 2005-038638 | 2/2005 |
| JP | 2005-190758 | 7/2005 |
| WO | WO 2007/055154 | 5/2007 |

OTHER PUBLICATIONS

Machine translation of JP06054643B, published in 1994.*
Machine translation of JP2000285839 (cited by application), Published Oct. 13, 2000.*
H.S. Kim et al. "Performance of Zr/O/W Schottky emitters at reduced temperatures", 1997 American Vacuum Society.

(Continued)

*Primary Examiner* — Anh Mai
*Assistant Examiner* — Britt D Hanley
(74) *Attorney, Agent, or Firm* — Muramatsu & Associates

(57) ABSTRACT

An electron gun includes: an electron source; an accelerating electrode; an extraction electrode for extracting electrons from an electron emission surface of the electron source; a suppressor electrode for suppressing emission of electrons from a side surface of the electron source; and an electron beam converging unit for converging an electron beam of thermal field emission electrons emitted from the electron emission surface by applying an electric field to the electron emission surface. The electron beam converging unit is an electrostatic lens electrode which is placed between the extraction electrode and the accelerating electrode and having an opening portion in its center. A voltage is applied to the electrostatic lens electrode to converge the electron beam.

6 Claims, 16 Drawing Sheets

OTHER PUBLICATIONS

M. Troyon "Magnetic Field Emission Gun With Zirconiated Emitter: Performances at Low Voltage", Inserm 314, Nov. 3, 1988.

J. Orloff "Servey of Electron Sources for High-Resolution Microscopy", Nov. 3, 1988, Elsevier Science Publishers.

H. Takahashi et al, H08-184699, Japan, Electron Gun for High Energy Electron Accelerator Publication, Jul. 16, 1996.

Y. Terui et al., 2001-325910, Japan, Electron Gun and Its Method of Use Publication, Nov. 22, 2001, Corresponds to: US6903499.

T. Tomita et al., 64-76654, Japan, Lens for Field Emission Type Electron Gun Publication, Mar. 22, 1989.

M. Hayashi et al, 2000-285839, Japan, Electron Gun, and Exposure Device and Exposure Method Using It Publication, Oct. 13, 2000.

S. Hashimoto et al, 2005-38638, Japan, Electron Gun and Electron Beam Irradiation Apparatus Using the Same Publication, Feb. 10, 2005.

S. Watanabe et al. 2003-16987, Japan, Schottky Electron Gun and Electron Beam Device Publication, Jan. 17, 2003.

Y. Terui, 2005-190758, Japan, Electron Source Publication, Jul. 14, 2005.

M. Yamabe. et al, 59-12534, Japan, Thermal Electron Emitting Cathode Publication, Jan. 23, 1984.

H. Yasuda et al, WO 2007/055154, Japan, Electron Gun, Electron Beam Exposure System and Exposure Method Publication, May 18, 2007.

International Search Report, English translation of the International Search Report.

\* cited by examiner

FIG. 13

| ANGLE OF THE OPENING PORTION OF THE ELECTROSTATIC LENS ELECTRODE $\alpha$ | RADIUS OF THE CROSSOVER IMAGE $r_{co}$ (μm) | APERTURE ANGLE $\theta$ (mrad) | EMITTANCE $\varepsilon$ (μm·mrad) |
|---|---|---|---|
| 60 (OUTGOING SIDE) | 2.88 | 4.87 | 14.03 |
| 30 (OUTGOING SIDE) | 3.13 | 4.48 | 14.03 |
| 20 (OUTGOING SIDE) | 3.27 | 4.30 | 14.07 |

FIG. 14A
| ANGLE OF THE OPENING PORTION OF THE ELECTROSTATIC LENS ELECTRODE $\alpha$ | RADIUS OF THE CROSSOVER IMAGE $r_{co}$ ($\mu$m) | APERTURE ANGLE $\theta$ (mrad) | EMITTANCE $\varepsilon$ ($\mu$m·mrad) |
|---|---|---|---|
| 40 (INCIDENT SIDE) | 2.64 | 3.97 | 10.48 |
| 60 (OUTGOING SIDE) | 2.88 | 4.87 | 14.03 |
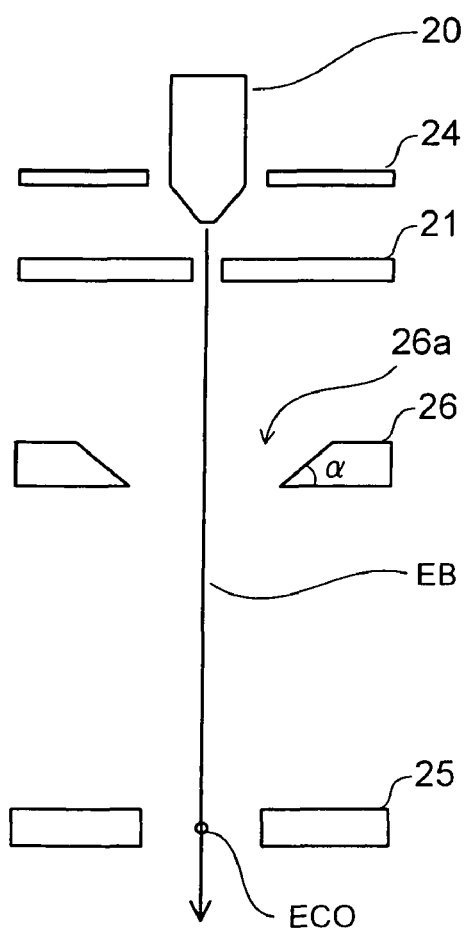
FIG. 14B
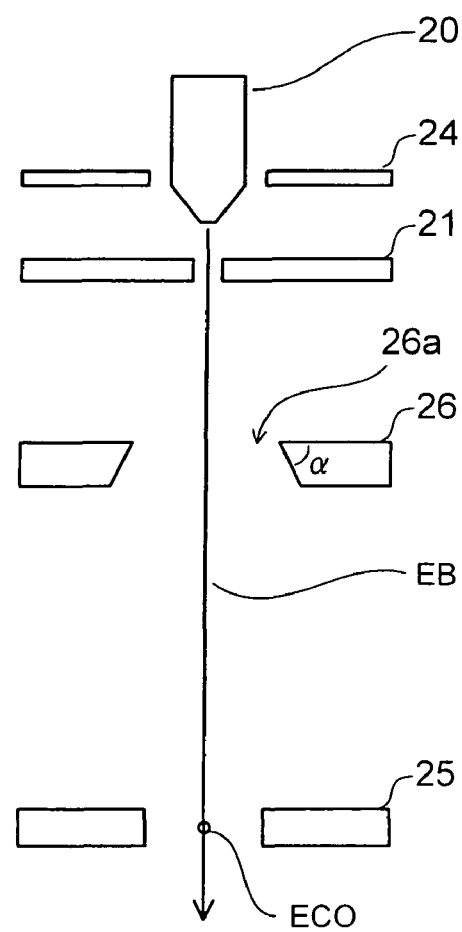
FIG. 14C

| DISTANCE FROM THE ELECTROSTATIC LENS ELECTRODE TO THE EXTRACTION ELECTRODE y (mm) | RADIUS OF THE CROSSOVER IMAGE $r_{co}$ (μm) | APERTURE ANGLE $\theta$ (mrad) | EMITTANCE $\varepsilon$ (μm·mrad) |
|---|---|---|---|
| 2 | 2.88 | 4.87 | 14.03 |
| 5 | 1.34 | 7.77 | 10.41 |

ELECTRON GUN MINIMIZING SUBLIMATION OF ELECTRON SOURCE AND ELECTRON BEAM EXPOSURE APPARATUS USING THE SAME

CROSS-REFERENCE TO RELATED APPLICATIONS

This application is a continuation of prior International Patent Application No. PCT/JP2007/069855, filed Oct. 11, 2007, which claims the benefit of foreign filing based on Japanese Patent Application No. 2007-056800 filed Mar. 29, 2007, the entire contents of which are incorporated herein by reference.

BACKGROUND OF THE INVENTION

1. Field of the Invention

The present invention relates to an electron gun and an electron beam exposure apparatus. Particularly, the present invention relates to an electron gun and an electron beam exposure apparatus which are suitable for saving the consumption of electron gun materials.

2. Description of the Related Art

Recent electron beam exposure apparatuses are configured to perform transfer exposure as follows to improve their throughputs. Specifically, each electron beam exposure apparatus is equipped with a mask having a variable rectangular opening or multiple mask patterns, and performs transfer exposure onto a wafer by selecting a desirable rectangular opening or mask pattern through beam deflection. An electron beam exposure apparatus making a cell projection exposure has been proposed as a method of making an exposure by use of multiple mask patterns. A cell projection exposure apparatus transfers a pattern onto a workpiece as follows. The cell projection exposure apparatus applies an electron beam onto a pattern area selected, through beam deflection, from multiple patterns arranged in a mask, and thereby forms the cross-section of the beam into a shape of the selected pattern. Then, the beam having passed the mask is again deflected and thus swung back by a deflector installed in its subsequent stage, and is reduced in size at a certain reduction ratio determined by its electro-optical system. Thereby, the pattern represented by the beam is transferred onto the workpiece.

In the exposure apparatus of this type, the securing of the line width precision is also important for the throughput improvement. To secure the line width precision, it is required that the strength of the electron beam emitted from the electron gun should not change with time. If the strength of the electron beam becomes weaker over time, the exposure degree gradually decreases. The exposure time may be extended to compensate for the decreased exposure degree. However, such exposure time extension would not only require a complicated control, but also reduce the throughputs.

In general, methods for causing an electron gun to emit electrons are roughly classified into a thermal electron emission type and a field emission type. An electron gun of the thermal electron emission type includes: a cathode for emitting electrons when heated; a Wehnelt cylinder for creating an electron flux by converging the electrons emitted from the cathode; and an anode for accelerating the converged electron flux.

The following phenomenon occurs when the thermal electron emission type (also referred to as "thermal field emission type") electron gun is used. Specifically, an electron emission portion of the electron gun changes its shape as an electron source (tip) used for the electron gun emits electrons. That is because a substance constituting the tip sublimes, evaporates, and thereby decreases in amount. Various countermeasures against this phenomenon have been put under examination. For instance, Japanese Patent Application Publication No. Hei 8-184699 discloses an electron gun including a tip whose surface is covered with a double-layered film consisting of a tungsten (W) layer and a rhenium (Re) layer so that the tip is consumed less than ever.

As described above, when the thermal electron emission type electron gun is used, the tip constituting the electron gun not only emits electrons, but also allows the substance constituting the tip itself to sublime in some cases. It is considered that the sublimation of the tip occurs because, when electrons are emitted by thermal electron emission, the tip is heated at a temperature higher than a sublimation temperature of the electron generating substance.

This sublimation changes the shape of the tip for emitting electrons. This change inhibits a uniform irradiation of the beam of the variable rectangle and the beam of the cell projection pattern, and decreases the strength of the emitted electron beam. For instance, in the case of a thermal electron emission type electron gun which includes a tip made of lanthanum hexaboride ($LaB_6$), and which heats the tip at 1500° C., 10 μm of lanthanum hexaboride sublimed in one month use.

The tip substance, for instance, $LaB_6$ or cerium hexaboride ($CeB_6$), adheres to the back of the grid through the sublimation. It is likely that this adhering substance may turn into whiskers, which may be charged with electrons and then discharge in minute scale. Once the micro discharge takes place in this manner, a phenomenon occurs in which the amount and irradiation position of an electron beam become unstable. This phenomenon hinders the normal use of the electron beam exposure apparatus, and also decreases the throughputs because it takes time for adjustment or the like. The most serious problem is a loss of the reliability of a pattern written while the micro discharge occurs. Accordingly, for enhancing the reliability of the electron beam exposure apparatus, it is essential to completely prevent the minute electrical discharge from occurring in the vicinity of the electron gun. In sum, the reduction in the amount of sublimation of the material for the electron gun is a prerequisite condition for developing a highly-reliable and highly-stable electron gun.

The electron beam exposure apparatus adopts a Koehler's illumination mode to make an even exposure on a mask pattern on the workpiece. The Koehler's illumination mode causes a crossover image of an electron beam to be formed on the pupil of the final lens. In the field emission type electron gun, for example, the virtual crossover image is as small as approximately 2 μm to 3 μm in size. This small crossover image decreases the illuminance and the electric current density, and eventually causes a problem of reduced exposure throughputs.

In addition, this small crossover image increases an angle at which the beam is emitted from the electron gun. As a result, it is likely that: a number of electrons may collide against the accelerating electrode which raises the temperature of the accelerating electrode; and the raised temperature may decrease the vacuum degree.

Furthermore, the electron gun disclosed by the Japanese Patent Application Publication No. Hei 8-184699 noted above reduces the consumption of its tip by covering the tip with the double-layered film consisting of the tungsten layer and the rhenium layer. However, the electron gun in this example is still incapable of preventing its electron emission surface from changing its shape through sublimation because the electron emission surface is not covered by the double-layered film.

SUMMARY OF THE INVENTION

The present invention has been made in consideration of the foregoing problems with the prior art. An object of the present invention is to provide an electron gun and an electron beam exposure apparatus which are usable for a longer period of time by reducing the amount of sublimation of the electron source and also reducing the emission angle of the beam.

The foregoing problems are solved by an electron gun including: an electron source for emitting electrons; an accelerating electrode, placed facing an electron emission surface of the electron source, for accelerating the electrons; an extraction electrode, placed between the electron emission surface and the accelerating electrode, for drawing the electrons from the electron emission surface; a suppressor electrode, placed in an opposite side of the electron emission surface from the extraction electrode, for suppressing emission of the electrons from a side surface of the electron source; and an electron beam converging unit for converging an electron beam of thermal field emission electrons, the thermal field emission electrons being emitted from the electron emission surface by applying an electric field to the electron emission surface while keeping a material for the electron source at a temperature low enough for a material for the electron source not to sublime.

The electron gun according to this aspect includes any one of: the electron beam converging unit using a convergent effect produced by a magnetic field lens; and the electron beam converting unit using a convergent effect produced by an electric field lens. First of all, descriptions will be provided for the electron beam converging unit using a convergent effect produced by a magnetic field lens.

In the electron gun according to this aspect, the electron beam converging unit is a magnetic field generator placed in a vicinity of the accelerating electrode. The magnetic field generator may be a permanent magnet having any one of north and south poles on the accelerating electrode side facing the electron source. In addition, the suppressor electrode may be made of a magnetic material.

In the electron gun according to the present invention, the permanent magnet is placed in the vicinity of the accelerating electrode to converge the electron beam of the thermal field emission electrons emitted from the electron source. The placement of the permanent magnet superposes an axially symmetric magnetic field over the electron beam in the vicinity of the extraction electrode of the electron gun, and the permanent magnet thereby exercises a lens effect on the electron beam. Due to this lens effect, the beam having passed the extraction electrode undergoes the convergent effect, and can form a magnified image of a crossover image in a vicinity of the accelerating electrode. The placement of the permanent magnet makes it possible to form the magnified image of the crossover image in a position which is separated by a short distance from the accelerating electrode. This formation of the magnified image of the crossover image makes it possible to minimize the Boersh's effect, and thus makes it possible to reduce the spread of the electron energy distribution. Furthermore, the formation of the magnified image of the crossover image makes it possible to prevent a decrease in the exposure throughputs which would be caused if the electric current density were low.

The convergent effect exercised on the electron beam decreases the aperture angle of the electron beam, and accordingly makes it possible to minimize the number of electrons colliding against the accelerating electrode. This makes it possible to restrain the rise of the temperature of the accelerating electrode, and thus to prevent the vacuum degree from decreasing.

Second, descriptions will be provided for the electrostatic lens incorporated in lieu of the electromagnetic lens. In the electron gun according to the foregoing aspect, the electron beam converging unit is an electrostatic lens electrode being placed between the extraction electrode and the accelerating electrode, and having an opening portion in its center. The electron beam of the thermal field emission electrons may be converged by applying a voltage to the electrostatic lens electrode. In addition, a side surface of the opening portion in the electrostatic lens electrode may have a taper structure in which the opening portion becomes progressively smaller toward the extraction electrode. Further, the side surface of the opening portion in the electrostatic lens electrode may have: a taper structure in which the opening portion becomes progressively smaller toward the accelerating electrode; and a taper structure in which the opening portion becomes progressively smaller toward the extraction electrode.

In the electron gun according to the present invention, the electrostatic lens electrode having the opening portion in its center is placed between the extraction electrode and the accelerating electrode, and the electron beam is converged by applying the voltage to the electrostatic lens electrode. This makes it possible to converge the electron beam in a position which is separated by a short distance from the accelerating electrode, and thus to form the crossover magnified image in a vicinity of the accelerating electrode.

Moreover, the side surface of the opening portion formed in the electrostatic lens electrode has the taper structure. The adjustment of this taper angle makes it possible to converge the electron beam in a position which is separated by a short distance from the accelerating electrode, and accordingly makes it possible to offer an optimal emittance value.

Besides, in the electron gun according to the foregoing aspect, the material for the electron source may be any one of lanthanum hexaboride ($LaB_6$) and cerium hexaboride ($CeB_6$). The side surface of the electron source, excluding the electron emission surface of the front end portion, may be covered with a substance which is different from the material for the electron source and which has a larger work function than the material for the electron source.

In the electron gun according to the present invention, only the electron emission surface of the tip front end portion of the electron source is exposed to the outside, whereas the remaining side portion of the electron source is covered with the different substance. In the case where, for instance, $LaB_6$ is used as the electron generating material, this different substance is carbon (C), for instance. Because the electron gun including such an electron source is operated at a lower temperature, the tip undergoes almost no sublimation. This prevents the electron emission surface of the electron gun from changing its shape, and accordingly enables the electron gun to be stably used for a long period of time.

Additionally, because the electron gun is operated at a temperature low enough for the tip not to sublime, no electrons are emitted from the side surface of the electron source even if the strong electric field is applied to the electron source. That is also because the side surface of the electron source is covered with carbon. This prevents the electron emission surface of the electron gun from changing its shape, and thus makes it possible to prevent the phenomenon in which the temperature rises in an unexpected part to thereby decrease the vacuum degree.

BRIEF DESCRIPTION OF THE DRAWINGS

FIG. 13 is a diagram showing a comparison of emittance values obtained by changing the angle of the formation of an opening portion in the electrostatic lens electrode.

FIG. 14A is a diagram showing a comparison of emittance values obtained by changing the direction of the angle of the opening portion formed in the electrostatic lens electrode. FIGS. 14B and 14C are cross-sectional views (part 2) each showing placement and a shape of the electrostatic lens electrode.

DESCRIPTION OF THE PREFERRED EMBODIMENTS

Figure 1:
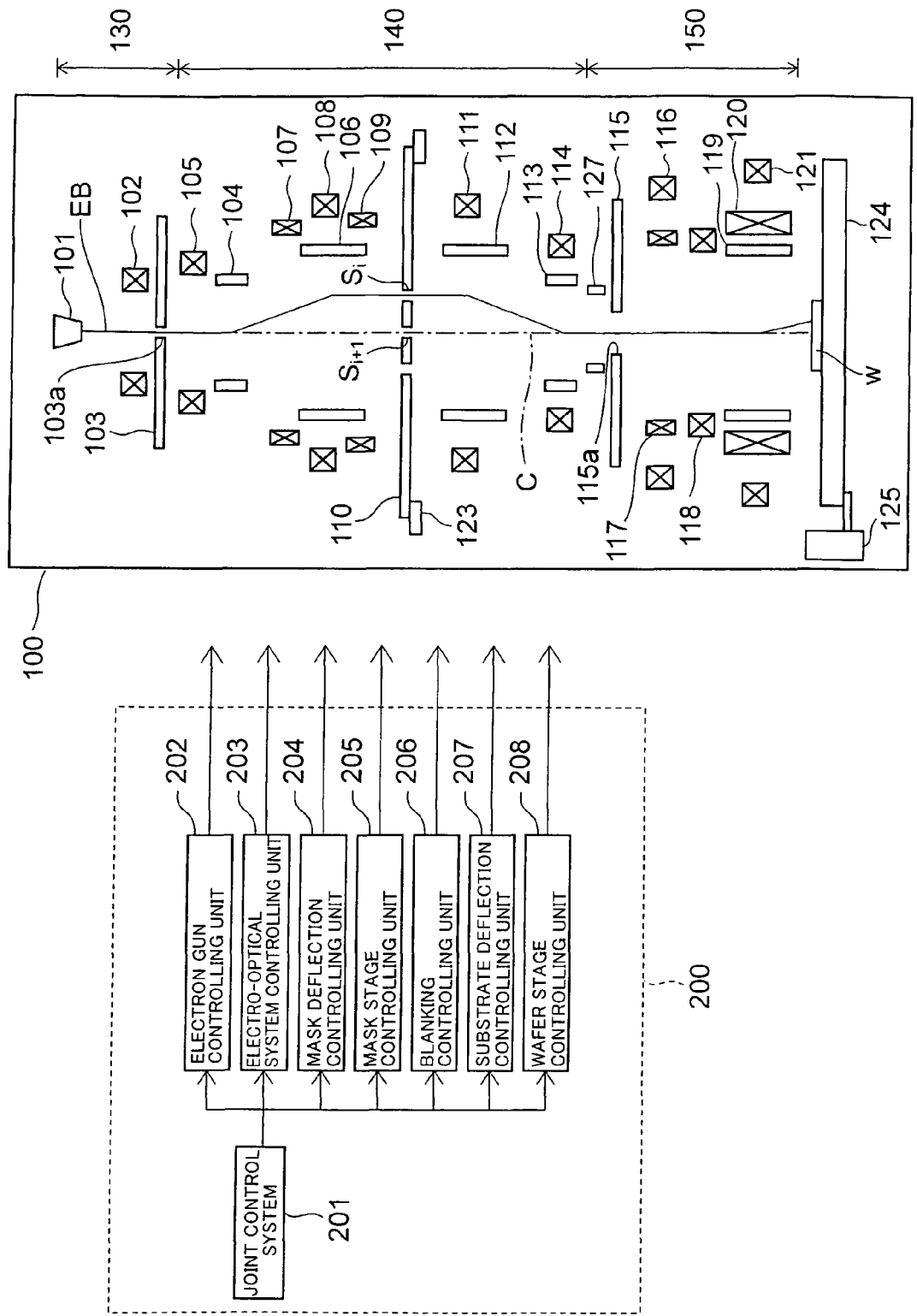
FIG. 1 is a diagram of a configuration of an electron beam exposure apparatus according to the present invention.

Referring to the drawings, descriptions will be hereinbelow provided for the embodiments of the present invention.
(1) First Embodiment First, a configuration of an electron beam exposure apparatus will be described. Second, a configuration of an electron gun will be described. Third, a configuration of an electron beam converging unit, which is a characteristic part of the electric gun, will be described. Fourth, a configuration of an electron source will be described.

(Configuration of Electron Beam Exposure Apparatus)

FIG. 1 shows a drawing of a configuration of an electron beam exposure apparatus according to a first embodiment.

This electron beam exposure apparatus is roughly broken down into an electro-optical system column 100 and a controller 200 for controlling the units which constitute the electro-optical system column 100. The electro-optical system column 100 includes an electron beam generator 130, a mask deflection unit 140 and a substrate deflection unit 150. The pressure of the interior of the electro-optical system column 100 is reduced.

In the electron beam generator 130, an electron beam EB is generated by an electron gun 101. A first electromagnetic lens 102 causes the electron beam EB to undergo a convergent effect. Thereafter, the resultant electron beam EB passes a rectangular aperture 103a of a beam shaping mask 103. Thereby, the cross-section of the electron beam EB is shaped into a rectangle.

Subsequently, a second electromagnetic lens 105 of the mask deflection unit 140 causes the electron beam EB to form an image on an exposure mask 110. Thereafter, a first electrostatic deflector 104 and a second electrostatic deflector 106 deflect the electron beam EB to a specific pattern Si formed on the exposure mask 110. Thus, the cross-section of the electron beam EB is shaped into the pattern Si.

It should be noted that, although the exposure mask 110 is fixed to a mask stage 123, the mask stage 123 is capable of moving in a horizontal plane. In a case where a pattern S exists in a position beyond a deflection range (beam deflection area) of the first electrostatic deflector 104 and the second electrostatic deflector 106, the pattern S is moved into their beam deflection ranges by moving the mask stage 123.

A third electromagnetic lens 108 arranged above the exposure mask 110 and a fourth electromagnetic lens 111 arranged under the exposure mask 110 play a roll of causing the electron beam EB to form an image on a substrate W by adjusting an amount of electric current flowing to the third electromagnetic lens 108 and an amount of electric current flowing to the fourth electromagnetic lens 111.

The electron beam EB having passed the exposure mask 110 is swung back to an optical axis C by deflection effects respectively of a third electrostatic deflector 112 and a fourth electrostatic deflector 113. Thereafter, the size of the electron beam EB is reduced by a fifth electromagnetic lens 114.

The mask deflection unit 140 includes a first correction coil 107 and a second correction coil 109. A beam deflection aberration produced by the first to fourth electrostatic deflectors 104, 106, 112, 113 is corrected by the first correction coil 107 and the second correction coil 109.

Thereafter, the electron beam EB passes an aperture 115a of a shielding plate 115 constituting the substrate deflection unit 150. Subsequently, the resultant electron beam EB is projected onto the substrate W by a first projection electromagnetic lens 116 and a second projection electromagnetic lens 121. Thereby, an image of a pattern of the exposure mask 110 is transferred onto the substrate W with a predetermined reduction ratio, for instance, with a reduction ratio of 1/10.

The substrate deflection unit 150 includes a fifth electrostatic deflector 119 and an electromagnetic deflector 120. These deflectors 119, 120 deflect the electron beam EB. Thus, the image of the pattern of the exposure mask is projected onto a predetermined position on the substrate W.

In addition, the substrate deflection unit 150 includes a third correction coil 117 and a fourth correction coil 118 each for correcting a deflection aberration of the electron beam EB on the substrate W.

The substrate W is fixed to a wafer stage 124 capable of being moved in the horizontal direction by a driver 125 such as a motor. An exposure can be made on the entire surface of the substrate W by moving the wafer stage 124.

The controller 200 includes an electron gun controlling unit 202, an electro-optical system controlling unit 203, a mask deflection controlling unit 204, a mask stage controlling unit 205, a blanking controlling unit 206, a substrate deflection controlling unit 207 and a wafer stage controlling unit 208. The electron gun controlling unit 202 controls the electron gun 101, and thus controls an acceleration voltage of the electron beam EB, conditions for beam irradiation, and the like. The electro-optical system controlling unit 203 controls an amount of electric current flowing to each of the electro-magnetic lenses 102, 105, 108, 111, 114, 116, 121, and thus adjusts the magnification, the focal position and the like of the electro-optical system in which these electro-magnetic lenses are configured. The blanking controlling unit 206 controls a voltage applied to a blanking electrode 127. Thus, the electron beam EB generated before the exposure is deflected to the shielding plate 115. Thereby, the blanking controlling unit 206 prevents the substrate from being irradiated with the electron beam EB before the exposure.

The substrate deflection controlling unit 207 controls a voltage applied to the fifth electrostatic deflector 119 and an amount of electric current flowing to the electromagnetic deflector 120. Thereby, the substrate deflection controlling unit 207 deflects the electron beam EB to a predetermined position on the substrate W. The wafer stage controlling unit 208 controls an amount of driving of the driver 125, and thus moves the substrate W in the horizontal direction. Thereby, the wafer stage controlling unit 208 causes the electron beam EB to be applied onto a desired position on the substrate W. The foregoing units 202 to 208 are jointly controlled by a joint control system 201 such as a workstation.

(Configuration of Electron Gun)

Figure 2:
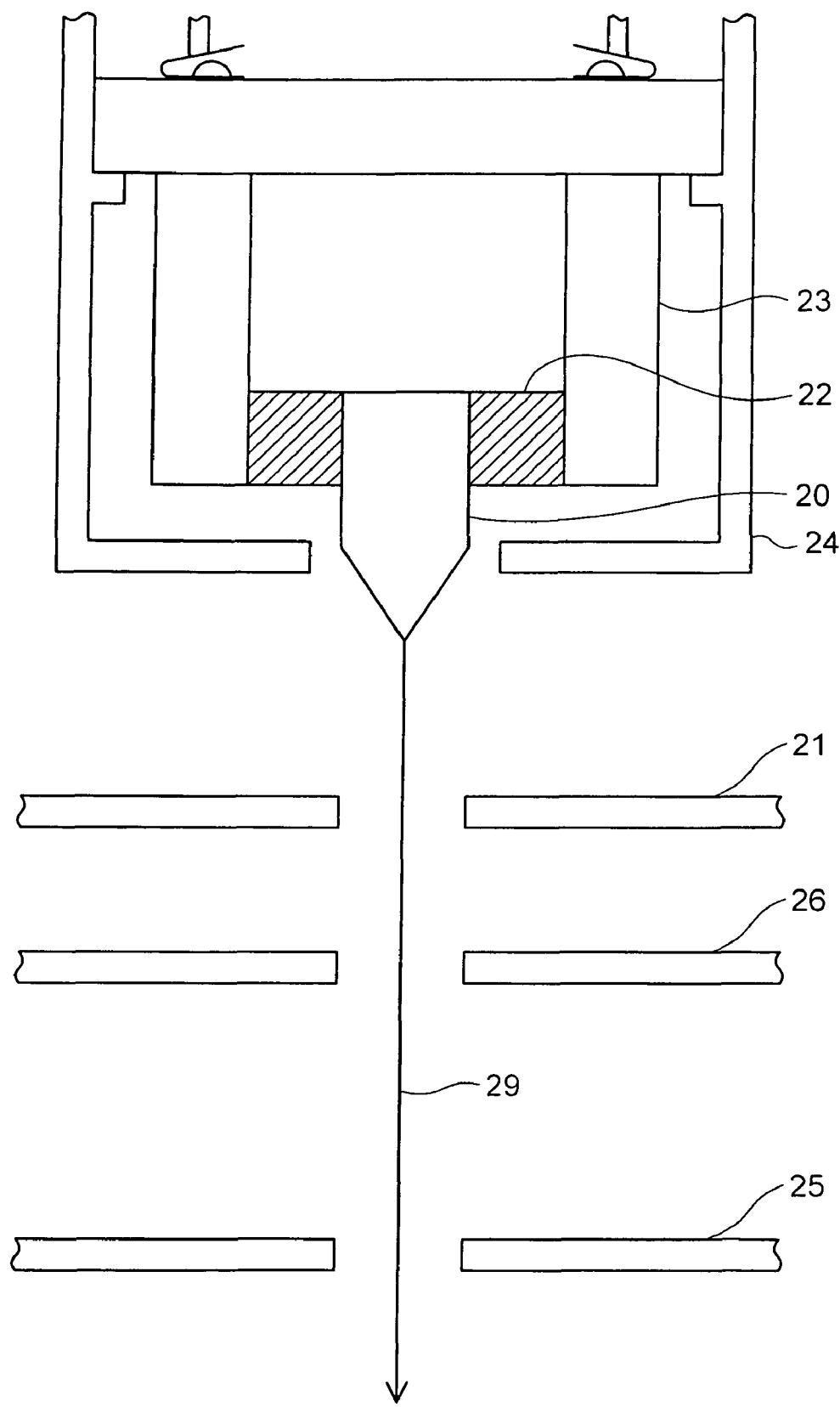
FIG. 2 is a diagram of an electron gun according to the present invention.

FIG. 2 shows a configuration of the electron gun 101. The electron gun 101 used for the first embodiment is of a thermal field emission type (also referred to as "thermal electron emission type"). The electron gun 101 includes: an electron source 20; an extraction electrode 21; an accelerating electrode 25 arranged under the extraction electrode 21; a carbon-made electron-source heater 22 arranged on the two sides of the electron source 20; a support 23 for supporting the electron source 20 and the electron-source heater 22; and a suppressor electrode 24 supporting and enclosing the support 23. For instance, single-crystal $LaB_6$ or $CeB_6$ is used for the electron source.

The extraction electrode 21 is an electrode to which a voltage is applied so as to produce a strong electric field over the front end of the electron source 20, and thereby to cause electrons to be emitted from the electron source 20. The extraction electrode 21 is placed in a position whose distance from the electron emission surface of the electron source 20 is not more than 2 mm.

The accelerating electrode 25 is an electrode to which a voltage is applied so as to accelerate electrons which are emitted from the electron source 20. The accelerating electrode 25 is placed in a position whose distance from the extraction electrode 21 is 20 mm.

In the electron gun 101 thus configured, an electron beam exposure is performed as follows. First, the electron gun controlling unit 202 continues applying an electron source heating voltage to the electron source heater 22, and thus raises the temperature of the electron source 20 to 1300° C. Thereafter, the electron gun controlling unit 202 applies a strong electric field between the suppressor electrode 24 and the extraction electrode 21. Thus, electrons are extracted from the electron source 20. Furthermore, the electron gun controlling unit 202 applies a voltage to the accelerating electrode 25 arranged under the extraction electrode 21, and thus causes an electron beam 29 with a predetermined energy to be outputted from the electron gun 101. Accordingly, the electron gun controlling unit 202 causes the electron beam 29 to be applied onto the substrate W which is fixed to the wafer stage 124, and which is coated with a resist. Thereby, an electron beam exposure is performed.

Here, the voltage applied to the suppressor electrode 24 is 0 kV to −0.5 kV, whereas the voltage applied to the extraction electrode 21 is 2.0 kV to 4.0 kV. These voltages are values relative to the electric potential of the electron source 20. Because the electric potential of the electron source 20 is usually −50 kV against the electric potential of true earth grounding, the voltages respectively applied to the suppressor electrode 24 and the extraction electrode 21 are obtained by adding −50 kV to their relative values.

Note that, the first embodiment causes the electron source 20 to emit electrons by applying the strong electric field to the interstice between the suppressor electrode 24 and the extraction electrode 21 while heating the electron source 20. For this reason, it is possible to prevent gas molecules from adsorbing to the surface of the electron source 20, and accordingly to prevent the luminance of the electron beam from decreasing.

In addition to the foregoing electrodes, an electrostatic lens electrode 26 may be arranged between the extraction electrode 21 and the accelerating electrode 25. The electrostatic lens electrode 26 is used to adjust the aperture angle of illumination of electrons applied from the electron source 20.

(Configuration and Operation of Electron Accelerator)

Next, referring to FIGS. 3 to 5, descriptions will be provided for the configuration and operation of an electron accelerator 40 which is used for the first embodiment.

In the electron gun of the thermal field emission type used for the first embodiment, the size of a virtual crossover image is small. For this reason, in the electron beam exposure apparatus which uses a variable rectangle or a cell projection pattern, it is important to enlarge the size of a crossover image of an emitted electron beam from a viewpoint of an efficient exposure.

It is a common practice, for the electron gun of the thermal field emission type used for the first embodiment, to form the magnified image of the crossover image (hereinafter also referred to as a "crossover magnified image") of the electron beam EB having passed the accelerating electrode 25 by a magnifying lens configured with an electromagnetic lens. However, such an electromagnetic lens brings about the following problems. First, the crossover magnified image is formed in a position which is separated by a long distance from the accelerating electrode 25. Second, the electron energy distribution becomes wider due to the Boersh's effect.

To shorten the distance from the accelerating electrode 25 to the position in which a crossover magnified image is formed, the inventors have paid attention to the field in which the electrons are accelerated.

Figure 3A:
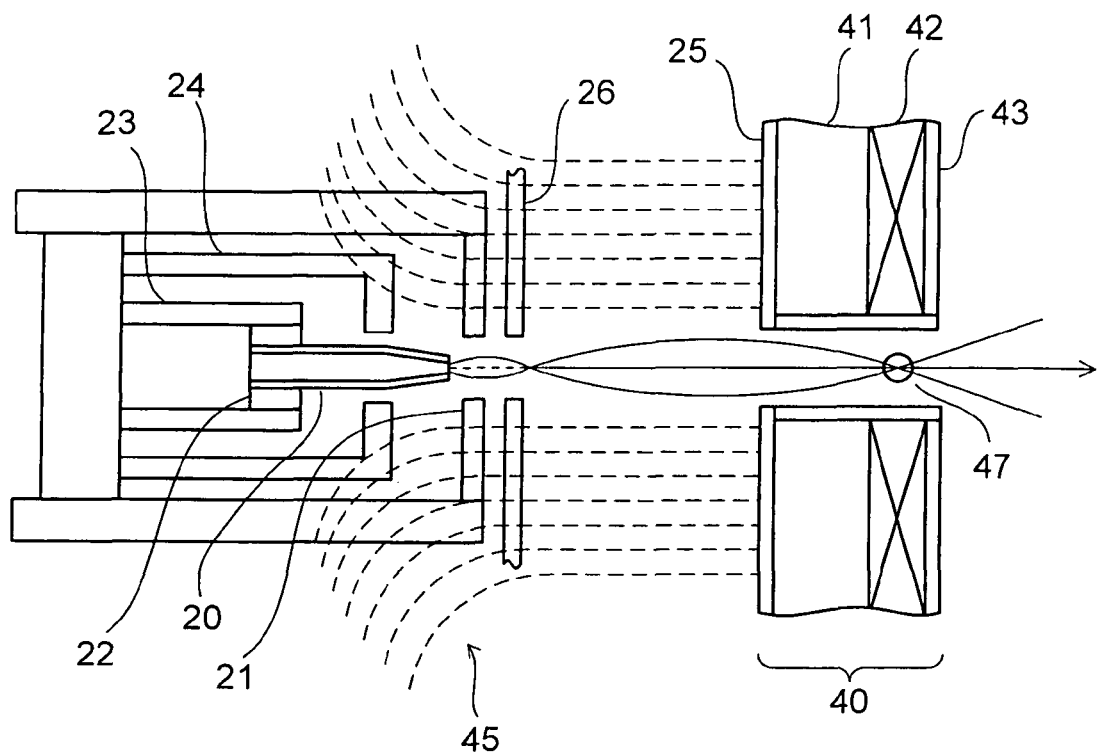
FIG. 3A is a diagram showing an example of a configuration of an electron accelerator and its corresponding magnetic field distribution.

FIGS. 3A, 3B, 4A and 4B are diagrams each explaining the configuration and operation of a magnetic-field superposition type electron gun. As shown in FIG. 3A, the magnetic field superposition type electron gun includes an electron accelerator 40 for accelerating electrons produced by the electron source 20.

The electron accelerator 40 includes the accelerating electrode 25, a permanent magnet 41, a magnetic field strength adjusting coil 42, and a magnetic field leakage preventing plate 43. The permanent magnet 41 and the magnetic field strength adjusting coil 42 are placed between the accelerating electrode 25 placed closer to the electron source 20 and the magnetic field leakage preventing plate 43 placed closer to the wafer stage 124.

Examples of the permanent magnet 41 include a neodymium magnet, a ferrite magnet and a samarium cobalt magnet. The permanent magnet 41 should desirably be a magnet with a high magnetic field strength. Among the three magnets, for instance, the neodymium magnet has the lowest Curie point which is 300° C., but has the highest magnetic field strength. For this reason, in a case where the temperature of the accelerating electrode 25 and in its vicinity is lower than 300° C., it is desirable that the neodymium magnet should be used as the permanent magnet 41.

The permanent magnet 41 is shaped like a ring, for instance. The permanent magnet 41 is placed with its north pole closer to the extraction electrode 21 and its south pole closer to the wafer stage 124, or vice versa. Note that the shape of the permanent magnet 41 is not limited to the ring. The permanent magnet 41 may be shaped like any other form, as long as the shape allows the permanent magnet 41 to produce a magnetic field in the space between the accelerating electrode 25 and the suppressor electrode 24.

The magnetic field strength adjusting coil 42 is a coil for causing the electron beam to form the crossover magnified image in the vicinity of the accelerating electrode 25 by finely tuning the magnetic field distribution which is produced by the permanent magnet 41.

The magnetic field leakage preventing plate 43 is a plate for preventing the leakage of the magnetic flux in order that the magnetic field strength produced by the permanent magnet 41 may not become weaker. The magnetic field leakage preventing plate 43 is made of pure iron, and is shaped like a disc, for instance.

Descriptions will be hereinbelow provided as to why the crossover magnified image can be formed on the optical axis in the vicinity of the electron accelerator 40 when the permanent magnet 41 is placed in the electron accelerator 40.

In FIG. 3A, broken lines 45 represent parts of magnetic force lines 45 which extend when the suppressor electrode 24 is made of pure iron.

As shown in FIG. 3A, the magnetic force lines 45 extend from the north pole of the permanent magnet 41 to the suppressor electrode 24 made of pure iron, pass the suppressor electrode 24, and then return to the south pole of the permanent magnet 41.

The electron beam radially emitted from the electron source is designed to pass through the magnetic field produced by the permanent magnet 41. This magnetic field acts on the velocity component of the electron beam which is orthogonal to the magnetic field. Thus, the trajectory of each electron is turned to the optical axis.

Figure 3B:
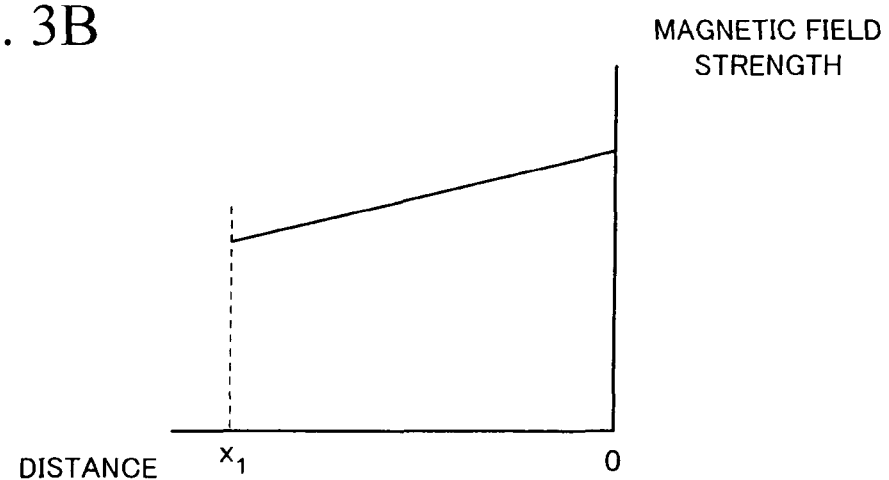
FIG. 3B is a diagram showing an example of a magnetic field strength produced by the electron accelerator shown in FIG. 3A.

FIG. 3B is a diagram showing the magnetic field strength between the electron accelerator 40 and the suppressor electrode 24. In FIG. 3B, the horizontal axis indicates the distance in the optical axis direction from the permanent magnet 41, and the vertical axis indicates the magnetic field strength. Because the magnetic force lines 45 extend straight from the front surface (the north pole) of the permanent magnet 41 to the suppressor electrode 24, the magnetic field strength becomes linearly weaker from the front surface of the permanent magnet 41 toward the suppressor electrode 24.

The first embodiment has been described on the assumption that the north pole is in one side of the permanent magnet 41 closer to the accelerated electrode 25 opposed to the electron source. Instead, however, the south pole may be in the side of the permanent magnet 41 closer to the accelerating electrode 25 opposed to the electron source.

In the case where, the magnetic field strength changes linearly as shown in FIG. 3B, the trajectory of each electron changes progressively larger as the electron comes closer to the accelerating electrode 25. Consequently, the electron beam forms the crossover magnified image 47 in the vicinity of the accelerating electrode 25.

Figure 5A:
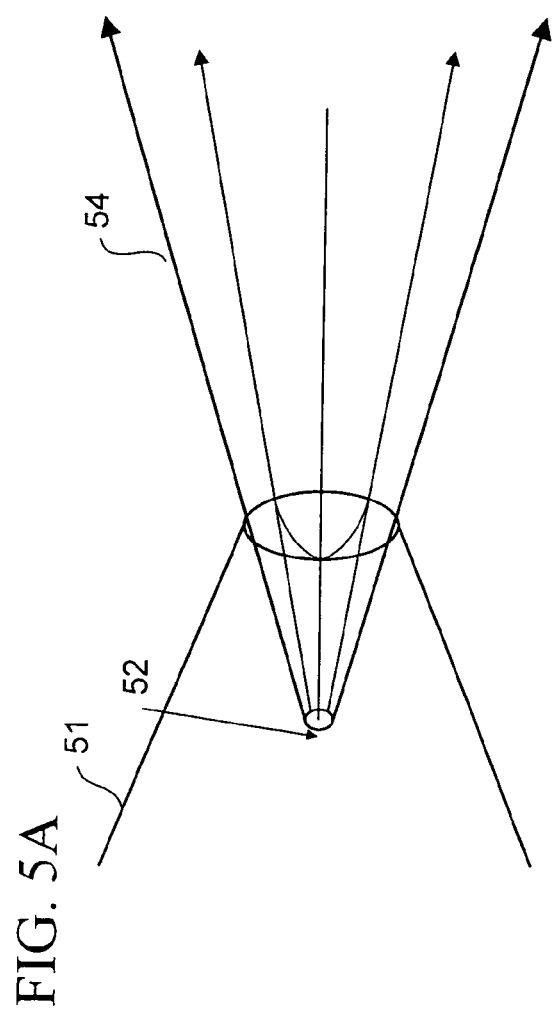
FIGS. 5A and 5B are diagrams each showing an example of a trajectory of an electron beam emitted from an electron source.
Figure 5B:
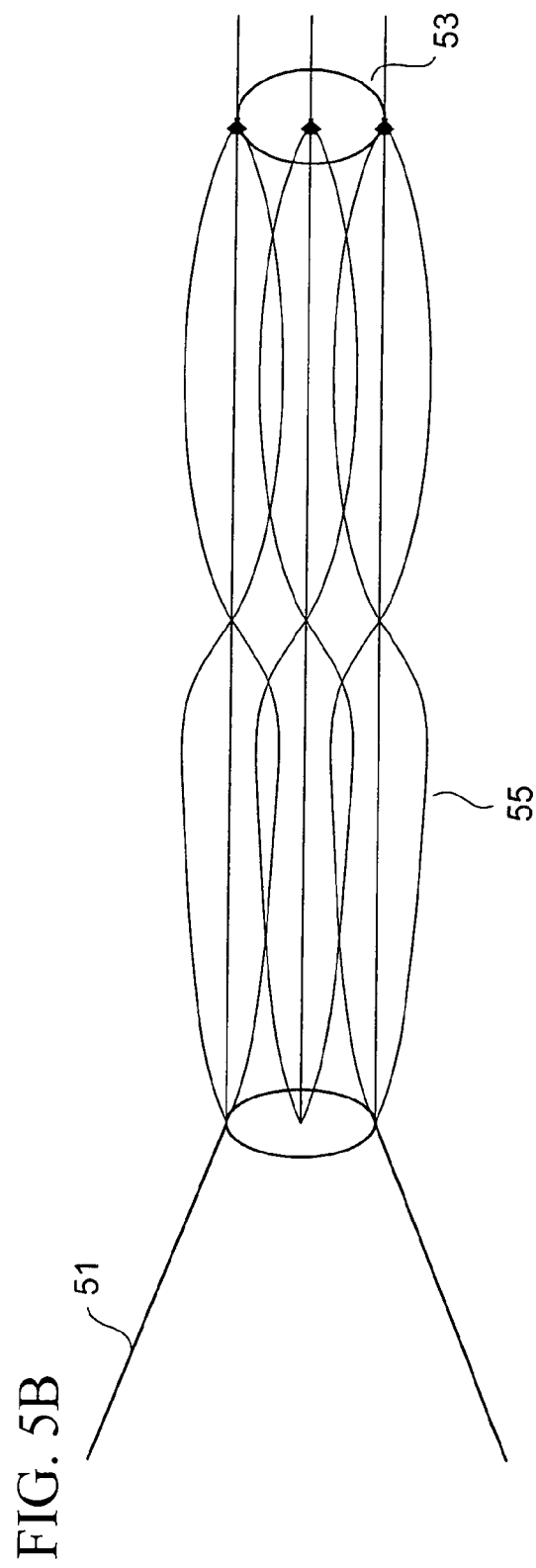

FIG. 5A is a diagram showing an electron beam 54 generated by an electron source 51, and FIG. 5B is a diagram showing an electron beam 55 generated by the electron source 51. FIG. 5A shows a trajectory described when the electron beam 54 generated by the electron source 51 is not influenced by an electromagnetic field. In the case of the thermal field emission type electron gun, a virtual crossover 52 is small, and the electron beam 54 spreads radially from the electron source 51. The thus-spread electron beam 54 turns into the convergent electron beam 55, when a magnetic field acts on the electron beam 54 as shown in FIG. 3. Consequently, the crossover magnified image 53 can be formed in a position which is separated by a short distance from the accelerating electrode 25.

Whether or not the electron beam is converged adequately, and whether or not the crossover magnified image is formed adequately are checked in accordance with a widely-known method using a detector for detecting an electric current value of an electron beam, like a Faraday cup. Specifically, change in an electric current value is checked by scanning the electron beam passing through a beforehand set-up aperture whose diameter is larger than the beam diameter of the crossover magnified image. If the electric current value changes gradually while the electron beam passes through the aperture, the electron beam can be judged as having a predetermined beam diameter. If the electric current value changes sharply while the electron beam passes through the aperture, the electron beam can be judged as having a small beam diameter. In addition, the electric current value is measured while changing the electric current supplied to the magnetic field strength adjusting coil 42. When the largest electric current is detected, the crossover magnified image may be judged as being formed.

FIG. 4 shows another example of the electron accelerator 40 using the permanent magnet 41.

Figure 4A:
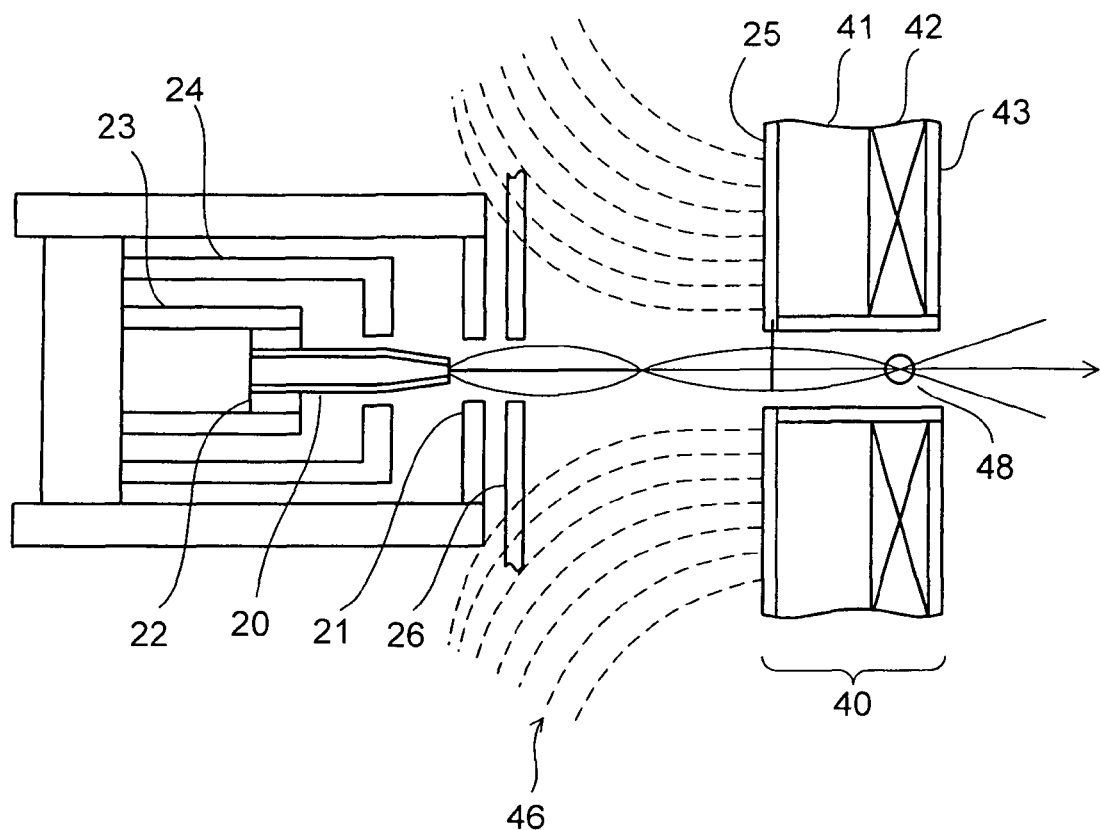
FIG. 4A is a diagram showing an example of a configuration of another electron accelerator and its corresponding magnetic field distribution.
Figure 4B:
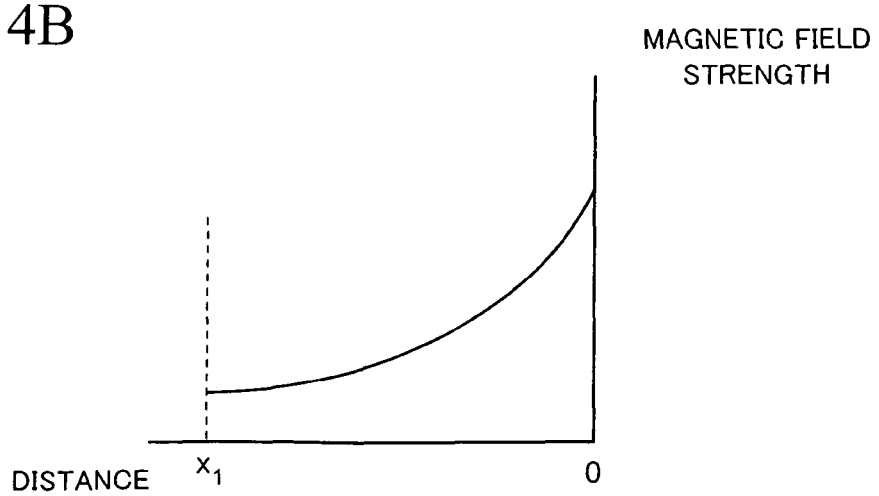
FIG. 4B is a diagram showing an example of a magnetic field strength produced by the electron accelerator shown in FIG. 4A.

In FIG. 4A, broken lines 46 represents parts of magnetic force lines 46 which extend when the suppressor electrode 24 is made of a non-magnetic material, for instance, a stainless steel. FIG. 4B is a diagram showing a magnetic field strength between the electron accelerator 40 and the suppressor 24.

As shown in FIG. 4A, the magnetic force lines 46 do not extend straight to the suppressor electrode 24, and return to the south pole while describing curved trajectories. For this reason, as shown in FIG. 4B, the magnetic field strength is distributed in a way that the magnetic field strength is the strongest near the accelerating electrode 25, and that the rate at which the magnetic field strength decreases becomes progressively larger as the magnetic force lines 46 extend farther away from the accelerating electrode 25.

When the electron beam travels in this magnetic field, the trajectory of each electron is turned to the optical axis. In this respect, electrons are less influenced by the magnetic field immediately after passing the extraction electrode 21, because the magnetic field strength is weak there. Accordingly, the electron beam thus emitted diverges almost as widely as an electron beam emitted when no permanent magnet 41 is provided diverges. As the electron beam comes closer to the accelerating electrode 25, electrons are progressively turned to the optical axis due to the influence of the magnetic field. Finally, the electron beam forms a crossover magnified image 48.

The magnetic field produced by the permanent magnet 41 thus adjusts the aperture angle of the electrons irradiated from the electron source 20. This makes it possible for the crossover magnified image to be formed in a position which is separated by a short distance from the accelerating electrode 25. This accordingly allows prevention of a decrease in the exposure throughputs, which would occur if the current density were lower.

In addition, the adjustment of the aperture angle prevents the accelerating electrode 25 from being irradiated with electrons. Not irradiated with an electron beam, the accelerating electrode 25 no longer generates heat. Accordingly, it is possible to prevent decrease in the degree of vacuum inside the exposure apparatus.

As described, the trajectory of the electron beam is turned to the optical axis due to the magnetic field and converges. Here, how much the electron beam converges depends on the generated electron beam and the magnetic field strength of the permanent magnet. For this reason, the magnetic field strength is determined by adjusting the thickness and polarization intensity of the permanent magnet so that the crossover magnified image can be formed in the vicinity of the accelerating electrode.

In addition, since the magnetic field produced by the permanent magnet 41 is constant, the magnetic field strength adjusting coil 42 is provided for finely tuning such constant magnetic field. The magnetic field strength adjusting coil 42 finely tunes the trajectory of the electron beam by superposing a magnetic field, which is produced by itself in response to a supplied electric current, on the magnetic field produced by the permanent magnet 41. Alternatively, the trajectory of the electron beam may be finely tuned by an electrostatic lens.

Furthermore, the permanent magnet may be placed not only in the electron accelerator 40, but also on the opposite side of the suppressor electrode 24 from the electron accelerator 40. Such placement of two permanent magnets can keep constant the magnetic field strength between the electron accelerator 40 and the suppressor electrode 24.

(Configuration of Electron Source)

Next, descriptions will be provided for a configuration of the electron source 20 used for the first embodiment.

Figure 6:
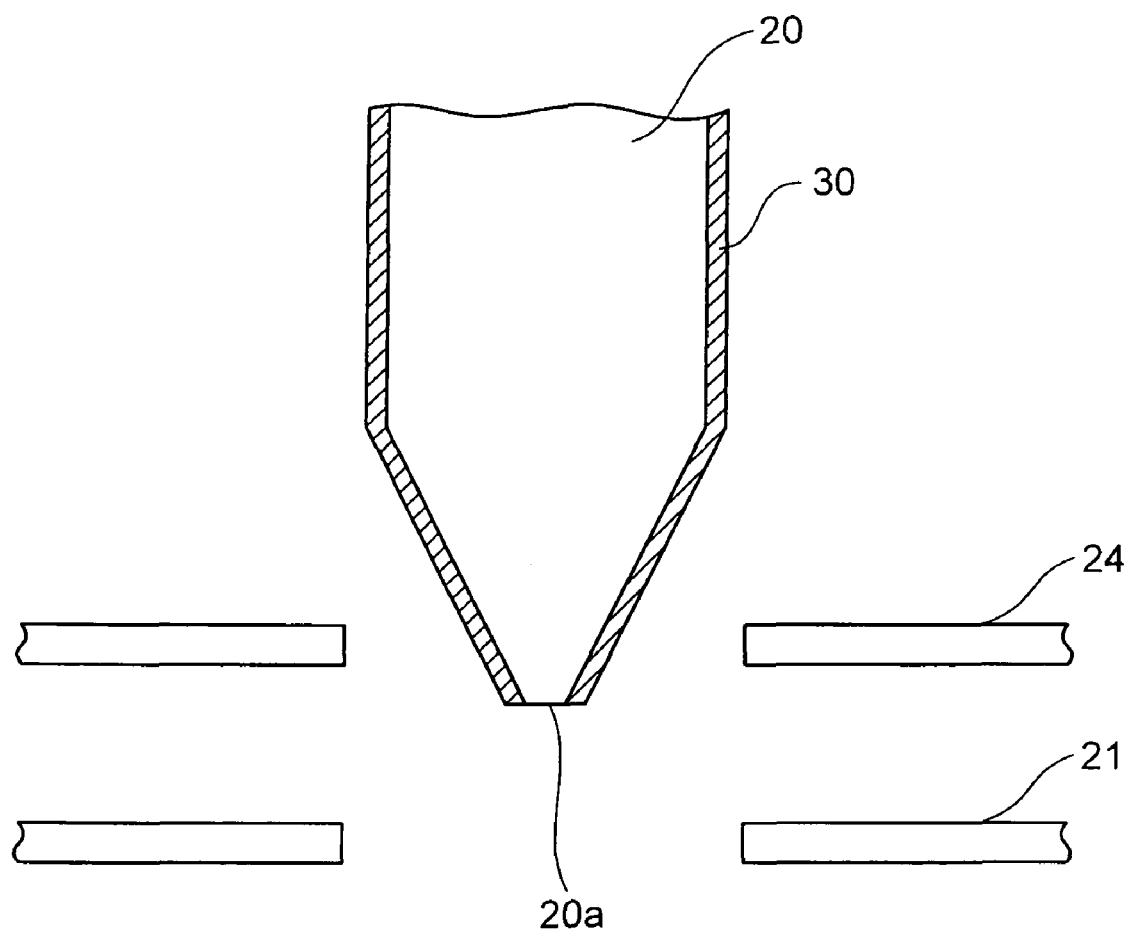
FIG. 6 is a diagram showing a positional relationship between the electron source and electrodes.

FIG. 6 is a cross-sectional view showing the electron source 20 and electrodes which constitute the electron gun 101.

The front end portion of the electron source 20 is shaped like a cone, and the electron source 20 is covered with carbon 30. This carbon 30 is deposited on the top surface of the electron source 20 by, for instance, CVD (chemical vapor deposition). The material of the electron source 20 is exposed to the outside in the front end of the electron source 20. The exposed portion of the electron source 20 is flattened.

The electron source 20 is placed so that the front end may be located between the suppressor electrode 24 and the extraction electrode 21. The suppressor electrode 24 is applied with 0 or a negative voltage, and thereby shields electrons emitted from portions other than the front end of the electron source 20. The magnetic field strength is determined depending on the voltage difference between the extraction electrode 21 and the suppressor electrode 24, the height and angle of the front end of the electron source 20, and the diameter of the flat portion of the front end of the electron source 20. The flat portion of the front end of the electron source 20 is placed in parallel with the suppressor electrode 24 and the extraction electrode 21.

The front end portion of the electron source 20 is cone-shaped, and an electron emission surface 20a from which to emit electrons is flat. The cone-shaped portion of the electron source is covered with a material which is different from the material for the electron source 20. It is desirable that the cone angle of the cone-shaped portion should be not more than 50°. The diameter of the surface from which to emit electrons should desirably be 10 μm to 100 μm, and is generally 80 μm. In addition, it is desirable that the material covering the electron source 20 should be 10 μm in thickness. Note that the electron source 20 is covered with the material different from the material for the electron source 20 for the following two purposes. First, electrons should be prevented from being emitted from the electron source 20. Second, the material constituting the substrate of the electron source 20 should be restrained from subliming or evaporating. The value of the thickness of the covering material depends on the electric field strength and what material is used as the covering material. If the covering material is less evaporated and accordingly less consumed at a use temperature, a thinner covering material is suitable for securing a stronger magnetic field strength.

The temperature applied to the electron source 20 should be lower than a temperature at which the material constituting the electron source 20 sublimes. If a high temperature is applied to the electron source 20 for thermal electron emission, the electron source 20 sublimes, and thereby the electron emission surface 20a would be consumed or accordingly deformed. This is why the temperature applied to the electron source 20 should be limited to a temperature which does not allow the material of the electron source 20 to sublime. However, electric current density and luminance identical to that the electron source 20 would obtain with a higher temperature has to still be obtained with a lowered temperature. To this end, it is designed such that electrons are extracted from the electron source 20 by applying a strong electric field to the front end portion of the electron source 20. For instance, assume the case in that the temperature is decreased 200° C. from 1500° C. In this case, if the work function can be reduced by 0.3 eV, it is possible to obtain the same luminance of the electron beam as what is obtained by thermal electron emission with the temperature being kept at 1500° C. Therefore, to allow the electron source 20 to emit electrons with the work function reduced by 0.3 eV, a high electric field is applied to the electron source 20 for emitting electrons.

In this situation, such application of a high electric field causes electrons to be extracted not only from the front end portion of the electron source 20 which constitutes the electron emission portion, but also from the side portion of the electron source 20 which is shaped like a cone. This makes it highly likely that neither a desired amount of electron beam nor a desired shape of the electron beam may be obtained, or that the luminance of the electron beam produced from the central portion of the electron source 20 may decrease due to a space-charge effect produced by peripheral superfluous electrons. To avoid these problems, as noted above, the electron source 20, except for its portion for the electron emission, is covered with a material which is different from the material for the electron source 20. As this different material, a material whose work function is larger than the work function of the material for the electron source 20 should be chosen.

In a case where $LaB_6$ is used for the electron source 20, it is desirable that carbon (C) should be used for the covering material because carbon does not react with $LaB_6$ and has a larger work function than $LaB_6$. Carbon reacts with oxygen. Accordingly, carbon may be consumed up through its evaporation as carbon dioxide ($CO_2$) if a carbon film is thin. With this taken into consideration, it is desirable that the thickness of the carbon film should be 2 µm to 10 µm. Also when $CeB_6$ whose properties are similar to the properties of $LaB_6$ is used for the electron source 20, the same carbon material is effective as the covering material.

In addition, when the temperature applied to $LaB_6$ and $CeB_6$ was 1100° C. to 1450° C., it was observed that the amount of evaporated $LaB_6$ and the amount of evaporated $CeB_6$ were $1 \times 10^{-10}$ µm. Based on this observation, it is desirable that the temperature applied to the electron source should be set at 1100° C. to 1450° C.

Figure 7B:
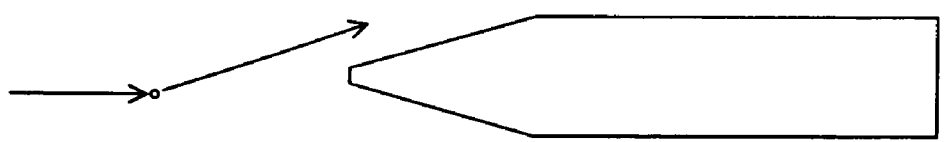
FIGS. 7A and 7B are cross-sectional views (part 1) each showing a shape of a front end portion of the electron source.
Figure 7A:
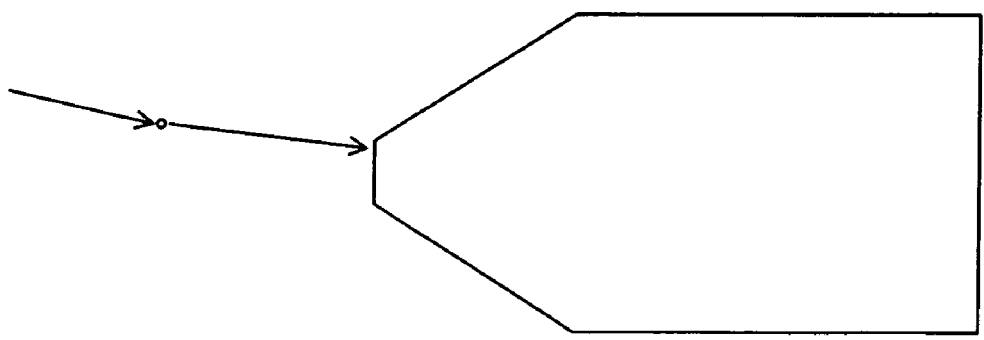

FIGS. 7A and 7B are cross-sectional views each showing the electron source 20. These electron sources 20 have different cone angles from each other. In general, a stronger electric field concentrates on the front end of the cone-shaped electron source 20 as the radius of the front end thereof becomes smaller and as the angle of the front end becomes acute. This concentration produces a tunneling phenomenon where electrons inside the electron source 20 tunnel more easily through the work function barrier of the front surface of the electron source 20. However, if the front end portion of the electron source 20 is too narrowed, the physical strength of the electron source 20 will be decreased. For this reason, the angle of the front end portion of the electron source 20 is determined considering the physical strength of the electron source 20 and the electric field strength.

FIG. 7A shows an electron source 20 whose front end portion has a cone angle of approximately 90°. FIG. 7B shows an electron source 20 whose front end portion has a smaller cone angle than the front end portion of the electron source 20 shown in FIG. 7A. Conventionally, the electron source 20 whose front end portion has a cone angle of approximately 90° as shown in FIG. 7A has been used. As the angle of the front end portion of the electron source 20 becomes acute as shown in FIG. 7B, the electric field concentrating on the front end portion of the electron source 20 becomes stronger, and the front end portion of the electron source 20 can accordingly emit electrons more easily. In addition, fine particles, including ions, existing inside the lens barrel are less likely to collide against the front end portion of the electron source. This makes it possible to reduce the consuming and deforming effect which ions and the like would otherwise exercise on the surface of the electron material 20.

In the first embodiment, the angle of the front end portion of the electron source 20 is set at approximately 30°. The electron source 20 according to the first embodiment can be used stably longer than electron sources of the conventional type, although it depends on the material for the electron source 20, and the sizes of the electron source 20 inclusive of its length, width and the like.

Figure 8A:
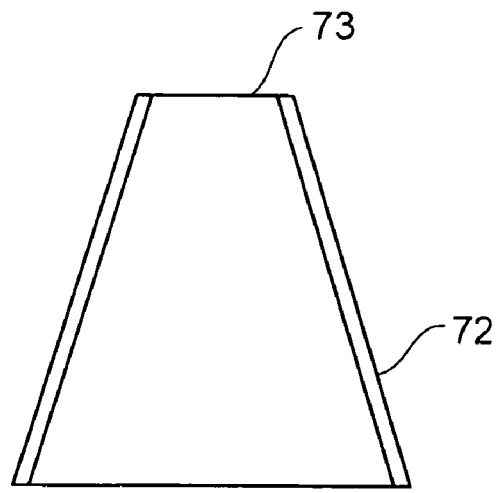
FIGS. 8A to 8D are cross-sectional views (part 2) each showing a shape of the front end portion of the electron source.
Figure 8B:
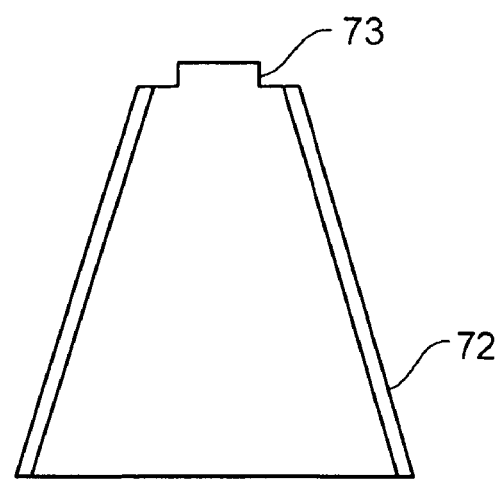
Figure 8C:
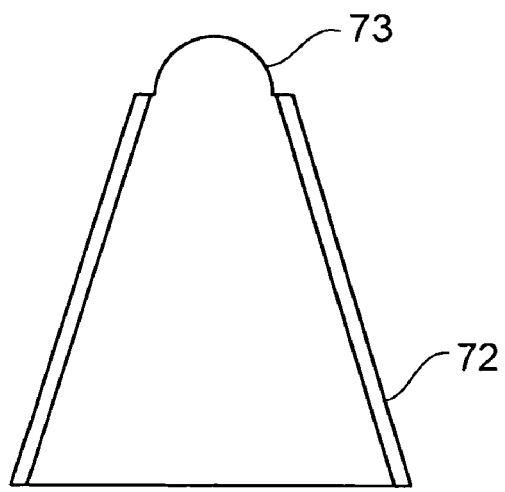
Figure 8D:
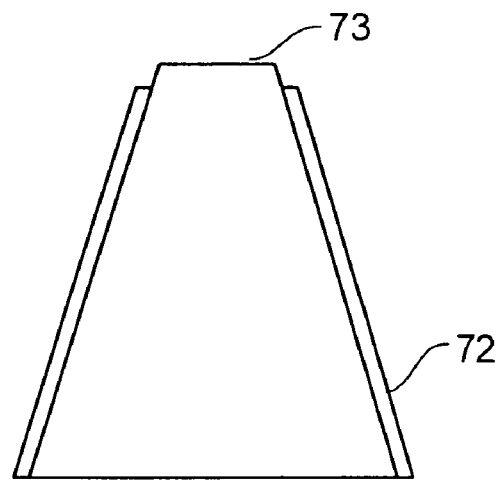

FIGS. 8A to 8D show cross-sectional views of the front end portions of the electron sources 20, in which the electron emission surfaces have the same diameter, but in which the electron emission surfaces are different from one another in shape. These cross-sectional views show other examples of the front end portions each for increasing the electric field strength through the electric field concentration. FIG. 8A shows an electron emission surface 73 formed as a flat surface. FIG. 8B shows the electron emission surface 73 formed as a convex surface. FIG. 8C shows the electron emission surface 73 formed as a spherical surface. FIG. 8D shows the electron emission surface 73 being formed as a flat surface and jutting out from the carbon covering film 72.

The convex and spherical electron emission surfaces 73 concentrate the electric field on their corresponding front end portions more easily than the flat electron emission surface 73, if the flat, convex and spherical electron emission surfaces 73 have the same diameter.

Note that the electron gun whose flat electron emission surface 73 juts out from the carbon covering film 72 as shown in FIG. 8D is capable of being continuously used as an electron gun, even in a case where the electron gun no longer keeps its electron emission surface flat due to consumption of the material of the electron source when the temperature of the electron gun becomes higher than a predetermined temperature for some reason.

Figure 9A:
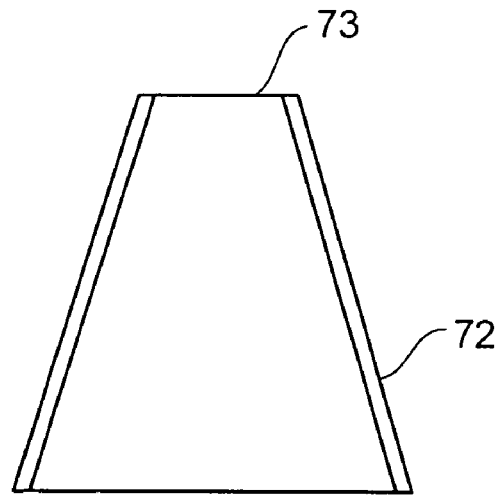
FIGS. 9A to 9C are cross-sectional views (part 3) each showing a shape of the front end portion of the electron source.
Figure 9B:
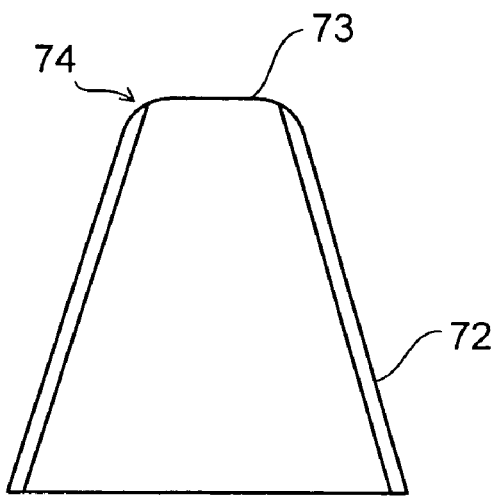
Figure 9C:
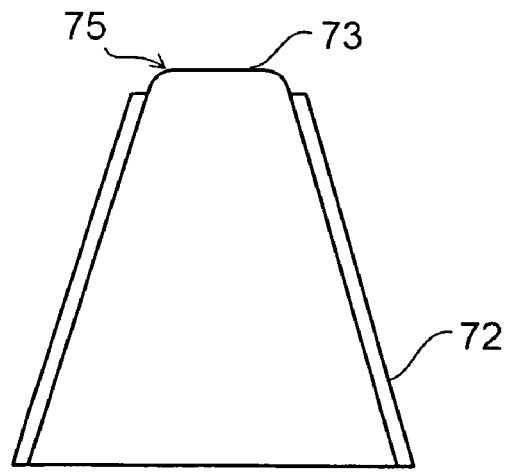

FIGS. 9A to 9C further show yet other examples of the front end portion of the electron source.

FIGS. 9A to 9C show cross-sectional views of the front end portions of the electron sources, which are shaped like a circular truncated cone. FIG. 9A shows the electron emission surface 73, of the electron source, being formed as a flat surface and having the carbon covering film 72 on the side surface of the electric source. FIG. 9B shows the electron emission surface 73 having a smooth curved surface, obtained by beveling a flat surface edge 74 of the front end portion of the electron source shown in FIG. 9A. FIG. 9C shows the electron emission surface 73 having a smooth curved surface, obtained by beveling an edge 75 of the electron emission surface of the front end portion of the electron source shown in FIG. 8D.

Figure 10A:
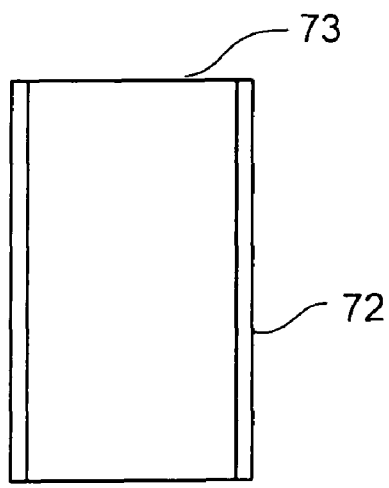
FIGS. 10A to 10C are cross-sectional views (part 4) each showing a shape of the front end portion of the electron source.
Figure 10B:
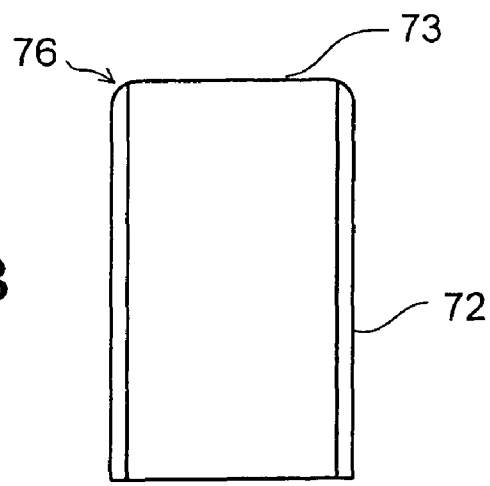
Figure 10C:
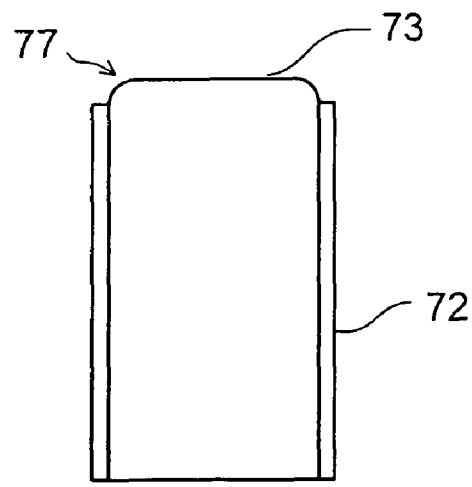

FIGS. 10A to 10C show cross-sectional views of the front end portions of the electron sources, which are shaped like a circular column. FIG. 10A shows the electron emission surface 73 of the electron source being formed as a flat surface and having the carbon covering film 72 on the side surface of the electron source. FIG. 10B shows the electron emission surface 73 having a smooth curved surface, obtained by beveling a flat surface edge 76 of the front end portion of the electron source shown in FIG. 10A. FIG. 10C shows the electron emission surface 73 being flat, jutting out from the carbon covering film, and having a smooth curved surface by beveling an edge 77.

In a case where the edge of the flat electron emission surface 73 is not beveled and accordingly not formed as a smooth curved surface, an electric field concentrates on the edge portion of the electron emission surface 73 when the electric field is applied to the electron emission surface 73. This makes electrons easily emitted from the edge portion. As a result, electrons are emitted in a wide range of directions, and the luminance of the electron beam accordingly decreases.

In addition, assume that the edge is not beveled and accordingly not formed as a smooth curved surface, and that the carbon covering film 72 is formed on the side surface of the electron source. In such a case, even if an electric field concentrates on the edge, presence of the carbon covering film 72 on the side surface of the electron source allows no electrons to be emitted from the edge. However, the amount of electrons emitted from the electron emission surface 73 reduces, and the luminance of the electron beam accordingly decreases.

For this reason, it is desirable that the edge of the flat surface of the front end portion of the electron source, including at least the electron emission surface 73, should be formed as a smooth curved surface by beveling off the edge at an angle which makes the smooth curved surface inclined as shown in FIGS. 9B, 9C, 10B and 10C.

Figure 11:
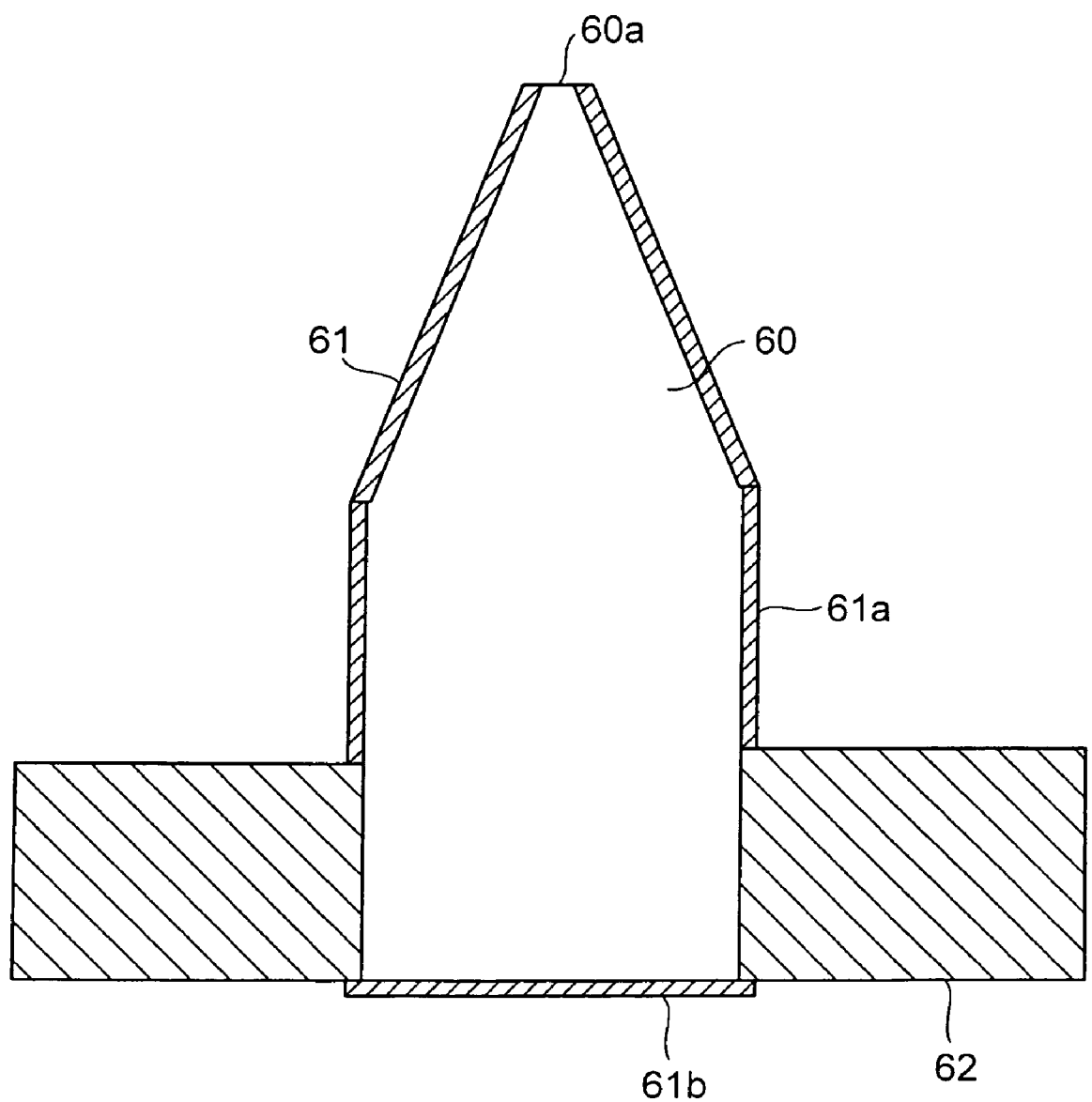
FIG. 11 is a cross-sectional view of an electron source, which is used to explain an area for restraining emission of electrons.

In the embodiment described above, the side surface of the electron source is an area for restraining the emission of electrons. Instead, as shown in FIG. 11, side surfaces (61, 61a) and a back surface 61b of the electron source 60, except for the electron emission surface 60a and an area surrounded by the carbon tip 62 electrified and thus heated, may be covered with a material different from the material for the electron source 60. In this case, it is possible to reduce the sublimation of the electron source 60, and thus to decrease the amount of matter deposited on the Wehnelt cylinder and the like.

The area for restraining electron emission is formed as follows.

In this respect, descriptions will be provided for the electron emission restraining area included in the electron source 20 which has the structure shown in FIG. 7, and for which single-crystal $LaB_6$ is used.

First of all, single-crystal $LaB_6$ is processed into a bar whose front end portion is shaped like a cone.

Subsequently, the $LaB_6$ bar is coated with the carbon 30 to form the electron emission restraining area. This coating process may be carried out by any one of CVD (Chemical Vapor Deposition), vacuum deposition, sputtering and the like. In this respect, the coated film may have any thickness, as long as it allows the work function of the electron emission surface to be altered sufficiently (or allows the work function of the electron emission surface to be larger than that of the $LaB_6$ bar), and concurrently as long as it is thick enough to prevent the $LaB_6$ material from evaporating. In a case where carbon is used, the carbon should desirably be 2 μm to 10 μm thick, considering that carbon evaporates as $CO_2$ through its reaction with oxygen.

Thereafter, the front end portion of the electron source 20 together with the coated film is polished and planarized to have a diameter of 1 μm to 200 ∞m.

With this, the electron source including the electron emission restraining area is formed.

As described above, in the case of the first embodiment, the permanent magnet 41 is placed in the electron accelerator 40. The electron beam emitted from the electron source 20 converges due to the magnetic field produced by the permanent magnet 41. This makes it possible to form the crossover magnified image in a position which is separated by a short distance from the accelerating electrode 25.

In addition, the magnetic field strength is determined by adjusting the thickness and polarization intensity of the permanent magnet 41 so that the crossover magnified image may be formed in the vicinity of the accelerating electrode 25. This makes it possible to enlarge the diameter of the crossover formed by the final-stage lens in the Koehler's illumination mode. Accordingly, this can prevent a decrease in the exposure throughputs which would be caused by a small electric current density.

Furthermore, it is designed such that the accelerating electrode 25 would not be irradiated with electrons through adjustment of the aperture angle of the electron beam. Thereby, the accelerating electrode 25 is no longer heated by irradiation of the electron beam. This makes it possible to prevent a decrease in the degree of vacuum inside the exposure apparatus.

Moreover, because the permanent magnet 41 is placed closer to the accelerating electrode 25, the configuration of the apparatus can be simpler than an apparatus in which the coil and the permanent magnet are placed on the high-voltage side including the electron source 20 and the like.

Besides, only the electron emission surface 20a in the tip front end portion of the electron source 20 is exposed to the outside of the electron source 20, and the remaining side surface of the electron source 20 is covered with the material different from the material for the electron source 20. Because the electron gun 101 including the thus-configured electron source 20 is operated at the lower temperature, the tip undergoes almost no sublimation. This enables the electron gun 101 to be used stably for a longer period of time while restraining the deformation of the electron emission surface 20a.

Additionally, because the electron gun 101 is operated at the temperature which does not cause the tip to sublime, a strong electric field is applied to increase the electric potential in the vicinity of the electron emission surface 20a. Even such application of the strong electric field does not cause electrons to be emitted from the side surface of the electron source 20 because the side surface of the electron source 20 is covered with the carbon 30. This makes it possible to prevent the electron beam from changing its own shape, and accordingly to prevent the phenomenon in which the vacuum degree decreases with the rise in the temperature of an unexpected part.

(2) Second Embodiment

Descriptions will be provided for a second embodiment in which an electrostatic lens electrode is used for the electron gun to converge the electron beam in a position which is separated by a short distance from the accelerating electrode. An electron beam exposure apparatus of the second embodiment mounted with the electron gun described above is similar to the electron beam exposure apparatus described as the first embodiment, and therefore descriptions thereof will be omitted. In addition, an electron source constituting the electron gun is also similar to the electron source described as the first embodiment, and therefore descriptions for the electron source constituting the electron gun for the second embodiment will be omitted.

In the first embodiment, the permanent magnet is placed in the vicinity of the accelerating electrode, and the magnetic field produced by the permanent magnet is used to converge the electron beam in a position which is separated by a short distance from the accelerating electrode.

In the second embodiment, before passing the accelerating electrode, the electron beam is converged by use of an electrostatic lens electrode with a predetermined shape. This convergence decreases the distance between the position in which the crossover magnified image is formed and the accelerating electrode.

The configuration of the electron gun according to the second embodiment is basically the same as the configuration shown in FIG. 2. However, there is a difference in the shape of the electrostatic lens electrode 26 of the second embodiment placed between the extraction electrode 21 and the accelerating electrode 25. The inventors have earnestly examined the shape and placement position of the electrostatic lens electrode to achieve convergence of the electron beam in a position with a short distance from the accelerating electrode, and have found a configuration which allows the electron beam to converge in a position with a short distance from the accelerating electrode, and which achieves an optimal emittance value.

Figure 12A:
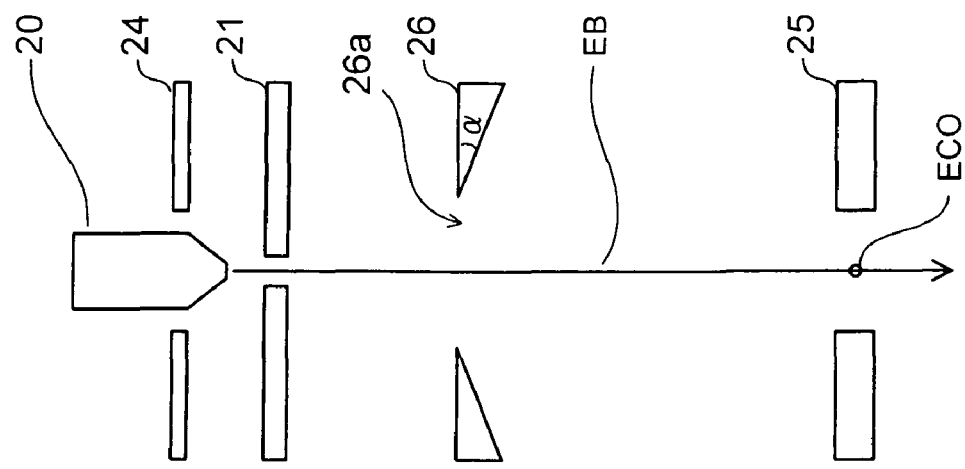
FIGS. 12A to 12C are cross-sectional views (part 1) each showing placement and a shape of an electrostatic lens electrode.
Figure 12B:
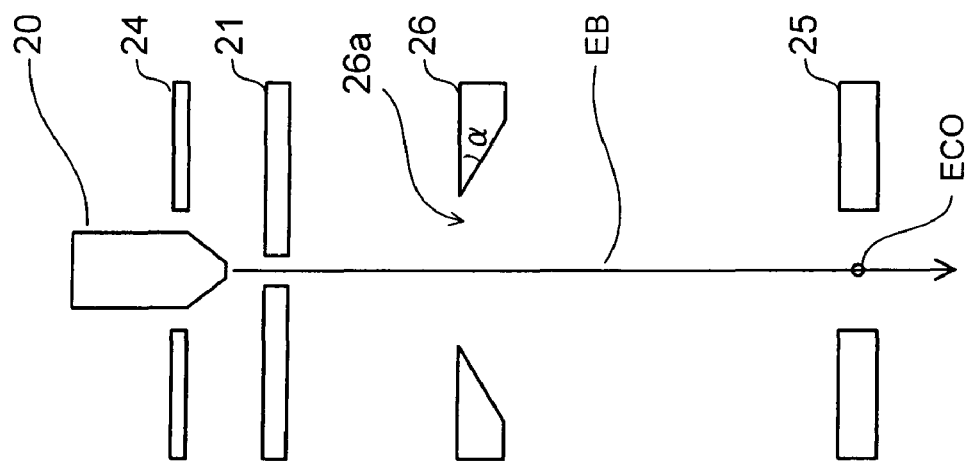
Figure 12C:
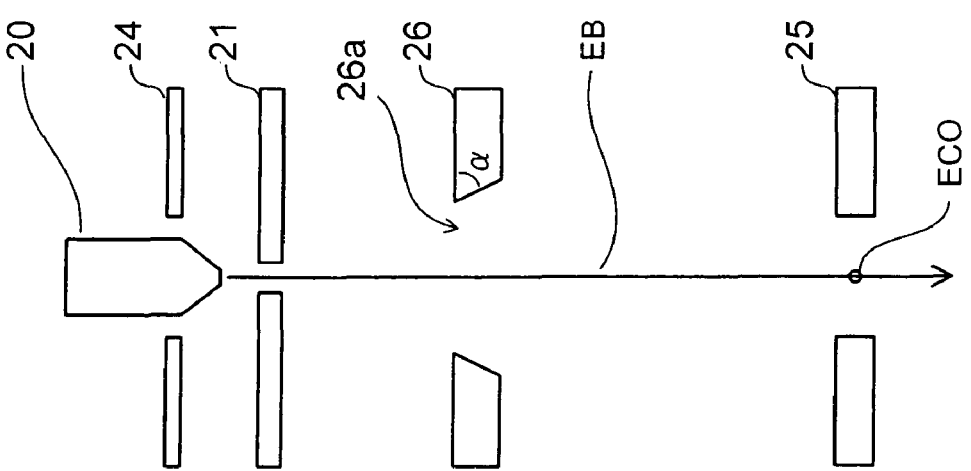

FIGS. 12A to 12C are schematic cross-sectional views each showing a basic configuration of the electron gun according to the second embodiment. Parts which are the same as those shown in FIG. 2 will be denoted by the same reference numerals, and detailed descriptions for such parts will be omitted.

As shown in FIGS. 12A to 12C, the electrostatic lens electrode 26 includes an opening portion 26a with a predetermined diameter around the optical axis. For instance, the thickness of the electrostatic lens electrode 26 is 1.2 mm, and the inner diameter of the opening portion 26a is 1.6 mm. The side surface of this opening portion 26a is tapered in the vertical direction.

In each of the electrostatic lens electrodes 26 shown in FIGS. 12A to 12C, the opening portion 26a has a tapered structure in which the side surface thereon becomes progressively thinner toward the extraction electrode 21 (toward the upper side in FIGS. 12A to 12C). An angle α formed between the side surface of the opening portion 26a of the electrostatic lens electrode 26 and the upper surface of the electrostatic lens electrode 26 closer to the extraction electrode is: 60° in FIG. 12A; 30° in FIG. 12B; and 20° in FIG. 12C.

Assume for instance that a voltage of 600V is applied to the electrostatic lens electrode 26 having the configuration shown in FIGS. 12A to 12C, and a voltage of 3 kV is applied to the extraction electrode 21. Then, the electron beam EB of electrons emitted from the electron source 20 undergoes the convergence operation due to the lens effect of the electrostatic lens electrode 26 when passing the opening portion 26a. Note that the voltage applied to the electrostatic lens electrode 26 may be set larger than the voltage applied to the extraction electrode 21.

A simulation was made for the second embodiment by changing the shape and position of the electrostatic lens electrode so as to: form the crossover magnified image ECO in the vicinity of the accelerating electrode 25 by converging the electron beam EB due to the lens effect to the electrostatic lens electrode 26; and obtain an optimal emittance value. In this respect, 14 μm·mrad was defined as the optimal emittance value.

FIG. 13 shows a comparison of emittance values obtained by changing the angle α of the opening portion 26a of the electrostatic lens electrode 26. FIG. 13 shows the values: radiuses $r_{co}$(μm) of the crossover image, aperture angles θ(mrad) of the electron emission, and emittances ε (μm·mrad). These values were respectively calculated by changing the taper angle α to 60°, 30°, and 20°. Here, the diameter of the front end of the electron emission surface 73 was set at 120 μm; the electric field strength in the front end of the electron emission surface 73 was set at $3 \times 10^5$(V/cm); and the opening portion 26a was tapered in a way that the side surface of the opening portion 26a became progressively wider toward the accelerating electrode 25 (the emission side).

As shown in FIG. 13, the smaller the taper angle α, the larger the emittance value. In addition, the larger the taper angle α, the larger the aperture angle. A larger taper angle allows the electrostatic lens electrode 26 to produce a larger lens effect. Consequently, the electron beam thus undergoes a strong convergence operation, making it possible to form the crossover magnified image ECO in the vicinity of the accelerating electrode 25.

FIGS. 14A and 14B show a comparison of emittance values obtained by changing the direction in which the taper angle was formed in the opening portion 26a of the electrostatic lens electrode 26. FIG. 14A shows values: radiuses $r_{co}$(μm) of the crossover image, aperture angles θ(mrad) of the electron emission, and emittances ε (μm·mrad). These values were respectively calculated by changing the direction of the taper formed in the opening portion 26a between a direction toward the incident side of the electron beam and a direction toward the outgoing side of the electron beam. Here, the diameter of the front end of the electron emission surface 73 was set at 120 μm; and the electric field strength in the front end of the electron emission surface 73 was set at $3 \times 10^5$ (V/cm).

Like FIGS. 12A to 12C, FIG. 14B shows a schematic cross-sectional view of a basic configuration of the electron gun, in which the electrostatic lens electrode 26 is tapered so that the opening portion 26a may open wider toward the incident side of the electron beam, or toward the extraction electrode 21. In contrast, FIG. 14C is like FIG. 12A, and shows a schematic cross-sectional view of another basic configuration of the electron gun, in which the electrostatic lens electrode 26 is tapered so that the opening portion 26a may open wider toward the outgoing side of the electron beam, or toward the accelerating electrode 25.

As shown in FIG. 14A, the emittance value is larger when the electrostatic lens electrode 26 is tapered so that the opening portion 26a may open wider toward the accelerating electrode 25 than when the electrostatic lens electrode 26 is tapered so that the opening portion 26a may open wider toward the extraction electrode 21.

Both the radius of the crossover and the aperture angle are smaller when the taper angle α was formed in the incident side of the electrostatic lens electrode 26 than when the taper angle α was formed in the outgoing side of the electrostatic lens electrode 26. A conceivable reason for such result is that: the electrostatic lens electrode 26 produced a weaker lens effect when the taper angle α was formed in the incident side of the electrostatic lens electrode 26 than when the taper angle α was formed in the outgoing side of the electrostatic lens electrode 26; and the weaker lens effect of the electrostatic lens electrode 26 made it impossible to increase the aperture angle for forming the crossover magnified image in the vicinity of the accelerating electrode 25.

Accordingly, to form the crossover magnified image in the vicinity of the accelerating electrode 25, it is desirable that the opening portion 26a be tapered so that the opening portion 26 may open wider toward the accelerating electrode 25.

Figure 15:
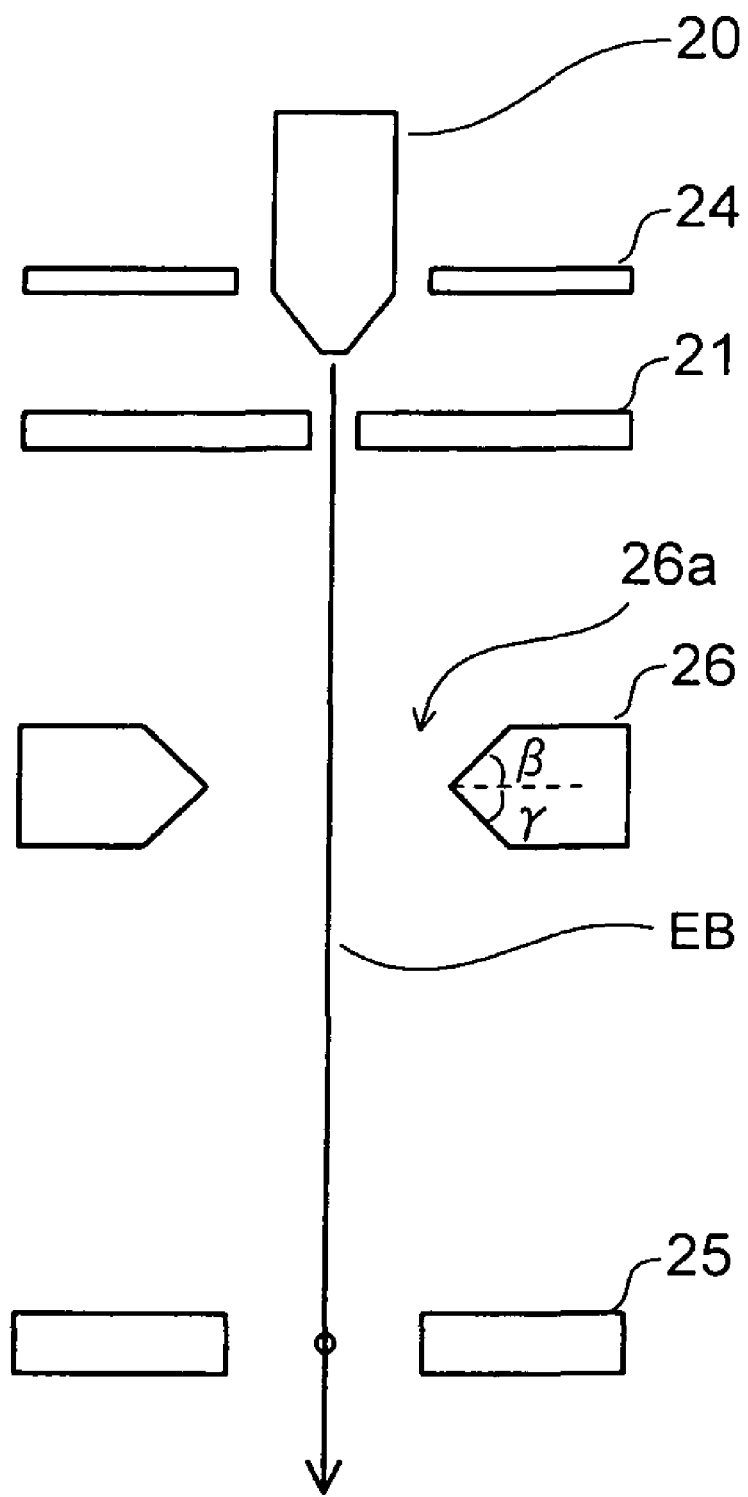
FIG. 15 is a cross-sectional view (part 3) showing placement and a shape of the electrostatic lens electrode.

Note that how the opening portion 26a of the electrostatic lens electrode 26 tapers is not limited to being inclined toward any one of the incident side and the outgoing side. For instance, as shown in FIG. 15, the electrostatic lens electrode 26 may taper so that the opening portion 26a may be narrow at a midpoint of the electrostatic lens electrode 26. Specifically, the side surface of the opening portion 26a on the extraction electrode 21 side may taper off toward the midpoint of the electrostatic lens electrode 26 and incline at a taper angle β, and the side surface beyond the midpoint may taper off toward the accelerating electrode 25 side and incline at a taper angle γ.

Next, descriptions will be provided for the position to place the electrostatic lens electrode 26.

Figures 16A, 16B:
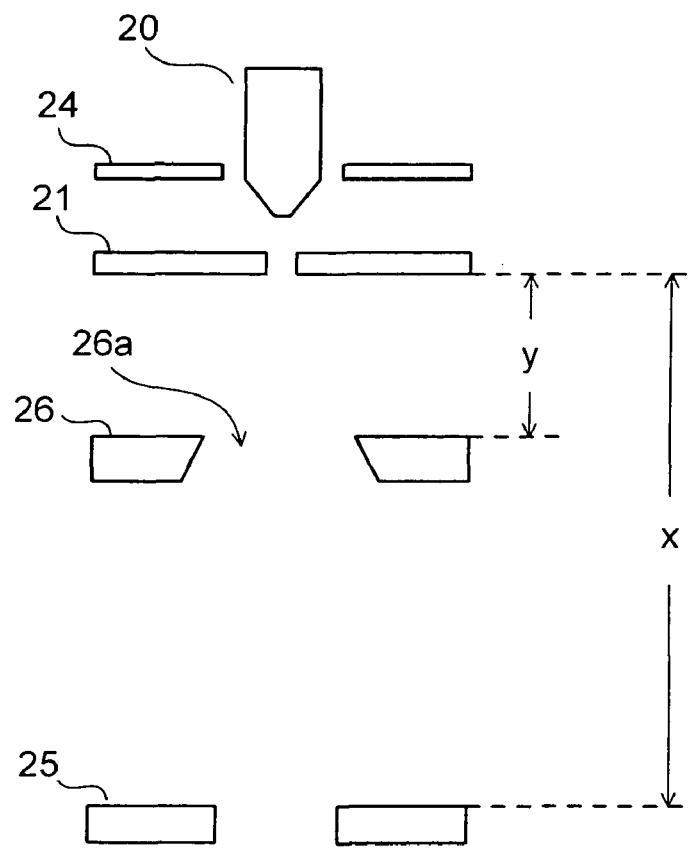
FIG. 16A is a diagram showing a comparison of emittance values obtained by changing the position of the electrostatic lens electrode.
FIG. 16B is a cross-sectional view showing the position of the electrostatic lens electrode.

FIGS. 16A and 16B show relationships between emittance values and distances from the electrostatic lens electrode 26 to the extraction electrode 21. FIG. 16A shows the values: radiuses $r_{co}$(μm) of the crossover image, aperture angles θ(mrad) of the electron emission, and the emittance ε (μm·mrad). These values were respectively calculated by changing the distance y from the extraction electrode 21 to the electrostatic lens electrode 26 between 2 mm and 5 mm. Here, the diameter of the front end of the electron emission surface 73 was set at 120 μm; and the electric field strength in the front end of the electron emission surface 73 was set at $3 \times 10^5$(V/cm). The distance x from the extraction electrode 21 to the accelerating electrode 25 was set at 20 mm, and the opening portion 26a formed in the electrostatic lens electrode 26 was angled at 60° on the outgoing side.

As shown in FIG. 16A, the closer the electrostatic lens electrode 26 is to the extraction electrode 21, the larger the emittance value. As the electrostatic lens electrode 26 is located farther from the extraction electrode 21 and accordingly closer to the accelerating electrode 25, the lens effect of the electrostatic lens electrode 26 becomes larger. Consequently, the crossover magnified image can be formed in the vicinity of the accelerating electrode 25 even with a large aperture angle of the electron beam. However, the size of the crossover itself becomes smaller, and the emittance value accordingly becomes smaller.

In sum, a suitable emittance value is obtained when the electrostatic lens electrode 26 is closer to the extraction electrode 21. Nevertheless, it was observed that a suitable emittance value can be obtained when the distance y from the extraction electrode 21 to the electrostatic lens electrode 26 is 5% to 20% of the distance x from the extraction electrode 21 to the accelerating electrode 25.

In the electron gun according to the second embodiment, as described above, the electrostatic lens electrode 26 having the opening portion 26a in its center is placed between the extraction electrode 21 and the accelerating electrode 25, and the electron beam is thus converged by applying the voltage to the electrostatic lens electrode 26. This makes it possible to converge the electron beam in a position which is separated by a short distance from the accelerating electrode 25, and accordingly to form the crossover magnified image in the vicinity of the accelerating electrode 25.

Furthermore, the opening portion 26a formed in the electrostatic lens electrode 26 has the tapered structure at its side surface. The adjustment of the taper angle makes it possible to converge the electron beam in a position which is separated by a short distance from the accelerating electrode 25, and concurrently makes it possible to offer the optimal emittance value.

What is claimed is:

1. An electron gun comprising:
    an electron source for emitting electrons;
    an accelerating electrode, placed facing an electron emission surface of the electron source, for accelerating the electrons;
    an extraction electrode, placed between the electron emission surface and the accelerating electrode, for drawing the electrons from the electron emission surface;
    a suppressor electrode, placed in an opposite side of the electron emission surface from the extraction electrode, for suppressing emission of the electrons from a side surface of the electron source; and
    an electron beam converging unit for converging an electron beam of thermal field emission electrons emitted from the electron emission surface by applying an electric field to the electron emission surface while keeping the electron source at a temperature low enough for a material for the electron source not to sublime;
    wherein the electron beam converging unit is a magnetic field generator placed in a vicinity of the accelerating electrode, and
    wherein the magnetic field generator is a permanent magnet having any one of north and south poles on the accelerating electrode side facing the electron source, which generates the magnetic field that solely decreases from the accelerating electrode toward the suppressor electrode.

2. The electron gun according to claim 1, wherein
    the suppressor electrode is made of a magnetic material, and the magnetic generator generates the magnetic field that linearly decreases from the accelerating electrode toward the suppressor electrode.

3. The electron gun according to claim 1, further comprising:
    an electrostatic lens electrode placed between the extraction electrode and the accelerating electrode; and
    an electromagnetic coil placed in a vicinity of the magnetic field generator,
    wherein the electron beam is converged by adjusting an electric current or voltage supplied to any one of the electrostatic lens electrode and the electromagnetic coil.

4. The electron gun according to claim 1, wherein
    a permanent magnet is placed in an opposite side of the suppressor electrode from the magnetic field generator.

5. An electron beam exposure apparatus comprising the electron gun according to claim 1.

6. The electron gun according to claim 1, wherein
    the suppressor electrode is made of a non-magnetic material, and the magnetic generator generates the magnetic field that progressively decreases from the accelerating electrode toward the suppressor electrode.

* * * * *

UNITED STATES PATENT AND TRADEMARK OFFICE
CERTIFICATE OF CORRECTION

PATENT NO. : 8,330,344 B2
APPLICATION NO. : 12/586792
DATED : December 11, 2012
INVENTOR(S) : Yasuda et al.

Page 1 of 1

It is certified that error appears in the above-identified patent and that said Letters Patent is hereby corrected as shown below:

Title Page

(30) Foreign Application Priority Data, please change
"Mar. 29, 2007 (JP) .... 2007-056800" to
--Mar. 29, 2007 (WO) .... PCT/JP2007/056800--.

Column 1, line 12, please change
"Japanese Patent Application No. 2007-056800" to
--International Patent Application No. PCT/JP2007/056800--.

Signed and Sealed this
Nineteenth Day of March, 2013

Teresa Stanek Rea
*Acting Director of the United States Patent and Trademark Office*